(12) United States Patent
Sukekawa

(10) Patent No.: US 11,917,808 B2
(45) Date of Patent: Feb. 27, 2024

(54) SEMICONDUCTOR DEVICE AND METHOD OF FORMING THE SAME

(71) Applicant: MICRON TECHNOLOGY, INC., Boise, ID (US)

(72) Inventor: Mitsunari Sukekawa, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 17/484,757

(22) Filed: Sep. 24, 2021

(65) Prior Publication Data

US 2023/0098062 A1 Mar. 30, 2023

(51) Int. Cl.
| | |
|---|---|
| H01L 27/108 | (2006.01) |
| H10B 12/00 | (2023.01) |
| G11C 5/10 | (2006.01) |
| H01L 29/423 | (2006.01) |
| G11C 11/402 | (2006.01) |

(52) U.S. Cl.
CPC ............... *H10B 12/30* (2023.02); *G11C 5/10* (2013.01); *G11C 11/4023* (2013.01); *H01L 29/42372* (2013.01); *H10B 12/03* (2023.02)

(58) Field of Classification Search
CPC .... H10B 12/30; H10B 12/03; H10B 12/0335; H10B 12/05; H10B 12/482; G11C 5/10; G11C 11/4023; H01L 29/42372; H01L 28/90; H01L 21/764
See application file for complete search history.

(56) References Cited

U.S. PATENT DOCUMENTS

| | | | | |
|---|---|---|---|---|
| 2020/0343379 A1* | 10/2020 | Sharma | ............ | H01L 29/78684 |
| 2022/0115383 A1* | 4/2022 | Yoon | .................. | H10B 12/0335 |
| 2022/0189515 A1* | 6/2022 | Lee | .................... | H01L 29/78642 |
| 2023/0066312 A1* | 3/2023 | Zhu | ....................... | H10B 12/315 |

\* cited by examiner

*Primary Examiner* — Mohammed R Alam
(74) *Attorney, Agent, or Firm* — Dorsey & Whitney LLP

(57) ABSTRACT

An apparatus includes a semiconductor substrate; an access transistor including channel, source and drain regions arranged in a vertical direction to the semiconductor substrate and a gate-electrode facing to the channel region; a storage capacitor coupled to one of the source and drain regions; a bit-line coupled to the other of the source and drain regions; and a pull-out-electrode connected to the bit-line; wherein surfaces of the source and drain regions and the pull-out-electrode on the bit-line side is arranged at substantially the same height from the upper surface of the semiconductor substrate.

14 Claims, 19 Drawing Sheets

US 11,917,808 B2

SEMICONDUCTOR DEVICE AND METHOD OF FORMING THE SAME

BACKGROUND

In semiconductor devices exemplified by a dynamic random access memory, it has been recently desired to increase the memory capacity, but it has been technically difficult to increase the memory capacity by making the machining dimension finer. Therefore, a technique has been devised in which an access transistor and a storage capacitor of a memory cell are designed to have a vertical structure to reduce the planar area of the memory cell, thereby increasing the memory capacity.

BRIEF DESCRIPTION OF THE DRAWINGS

FIG. 1A and FIG. 1B to FIG. 6A and FIG. 6B, FIG. 7A to FIG. 7C, FIG. 8A and FIG. 8B, FIG. 9A and FIG. 9B, and FIG. 10A to FIG. 10C are diagrams illustrating a schematic configuration of a semiconductor device according to a first embodiment and a method of forming the same; FIG. 1A to FIG. 10A are plan views illustrating a schematic configuration of a semiconductor device in an exemplary process stage; FIG. 1B to FIG. 10B, FIG. 7C, and FIG. 10C are longitudinal sections illustrating a schematic configuration of a memory cell region in an exemplary process stage; FIG. 1B to FIG. 10B are cross sections illustrating a schematic configuration of a part along an A-A line of FIG. 1A to FIG. 10A; FIG. 7C and FIG. 10C are longitudinal sections illustrating an outline of a part along a B-B line of FIG. 7A and FIG. 10A, respectively;

FIG. 13 to FIG. 22 are plan views illustrating the schematic configuration of the semiconductor device in an exemplary process stage; FIG. 1B to FIG. 10B, FIG. 7C, and FIG. 10C are longitudinal sections illustrating a schematic configuration of a memory cell region in an exemplary process stage corresponding to FIG. 13 to FIG. 22; FIG. 1B to FIG. 10B are cross sections illustrating a schematic configuration of a part along an M-M line of FIG. 13 to FIG. 22, respectively; and FIG. 7C and FIG. 10C are longitudinal sections illustrating an outline of a part along an N-N line of FIG. 19 and FIG. 22, respectively.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Hereinafter, a semiconductor device according to an embodiment and a method of forming the same will be described with reference to the drawings. In the following description, a dynamic random access memory (hereinafter referred to as DRAM) will be described as an example of the semiconductor device. In the description of the embodiment, common or related elements, or substantially the same elements are designated by the same reference signs, and the description thereof will be omitted. In the following figures, dimensions of respective parts and dimensional ratios thereof in each figure do not necessarily match dimensions and dimensional ratios in embodiments. Further, in the following description, an X-direction is a direction parallel to word-lines. A Y-direction is a direction which is vertical to the X-direction and parallel to bit-lines. A Z-direction is a vertical direction to an X-Y plane which is the plane of a semiconductor substrate, and is sometimes referred to as a longitudinal direction. The X-, Y-, and Z-directions in the figures are displayed with reference to the direction of a first member H described later.

A method of forming the semiconductor device according to the first embodiment will be described below.

Figure 1A:
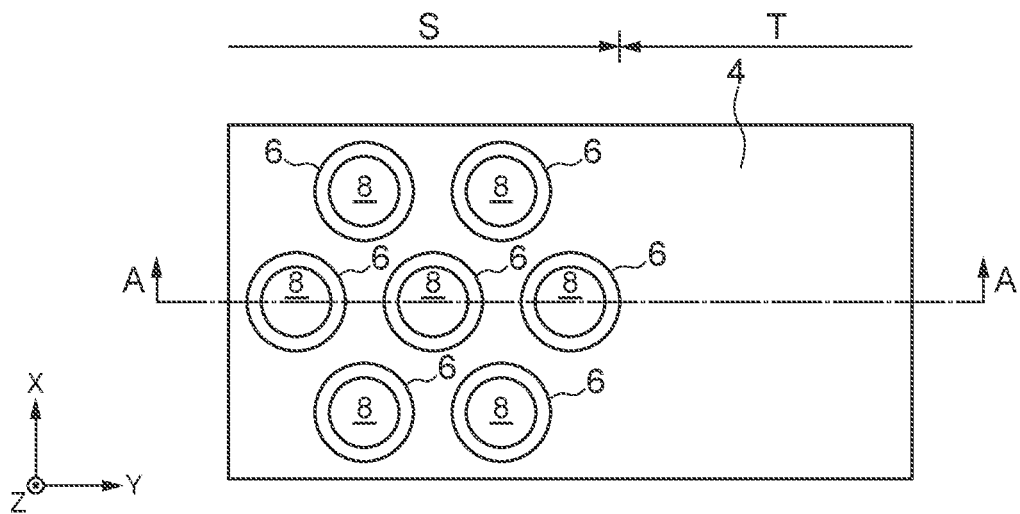
Figure 1B:
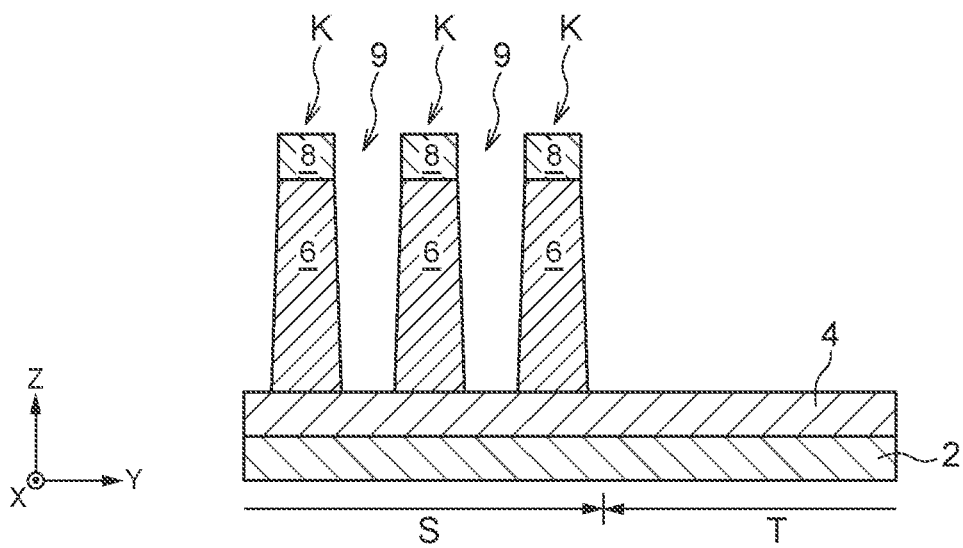

As illustrated in FIG. 1A and FIG. 1B, a first semiconductor layer 4, a second semiconductor layer 6, and a first insulating material layer 8 are laminated on a first semiconductor substrate 2 to form a film. The first semiconductor substrate 2 is provided with a memory cell region S and a peripheral region T.

The first semiconductor substrate 2 includes, for example, a disk-shaped single crystal silicon wafer having a principal plane which has been subjected to mirror-surface treatment. The first semiconductor layer 4 contains, for example, silicon germanium (SiGe). A film of silicon-germanium is formed, for example, by an epitaxial growth method. Silicon-germanium is formed so as to have a germanium (Ge) content of 20% to 30%, for example.

The second semiconductor layer 6 contains, for example, silicon (Si). The second semiconductor layer 6 can be formed, for example, by an epitaxial growth method. The first insulating material layer 8 contains, for example, a silicon nitride film (SiN). The first insulating material layer 8 can be formed, for example, by a chemical vapor deposition method (hereinafter referred to as CVD).

Next, the first insulating material layer 8 and the second semiconductor layer 6 are patterned by using a known lithography technique and an anisotropic dry etching technique. The surface of the first semiconductor layer 4 is exposed by this etching, thereby forming a plurality of island-shaped structures K which extend in a vertical direction to the first semiconductor substrate 2 and are arranged independently of one another. The island-shaped structures K are formed in the memory cell region S. Each of the island-shaped structures K is formed on the first semiconductor layer 4, and a patterned second semiconductor layer 6 and a patterned first insulating material layer 8 are stacked in each of the island-shaped structures K. Gaps 9 are provided between the island-shaped structures K. A structure illustrated in FIG. 1A and FIG. 1B is formed by the above step.

Figure 2A:
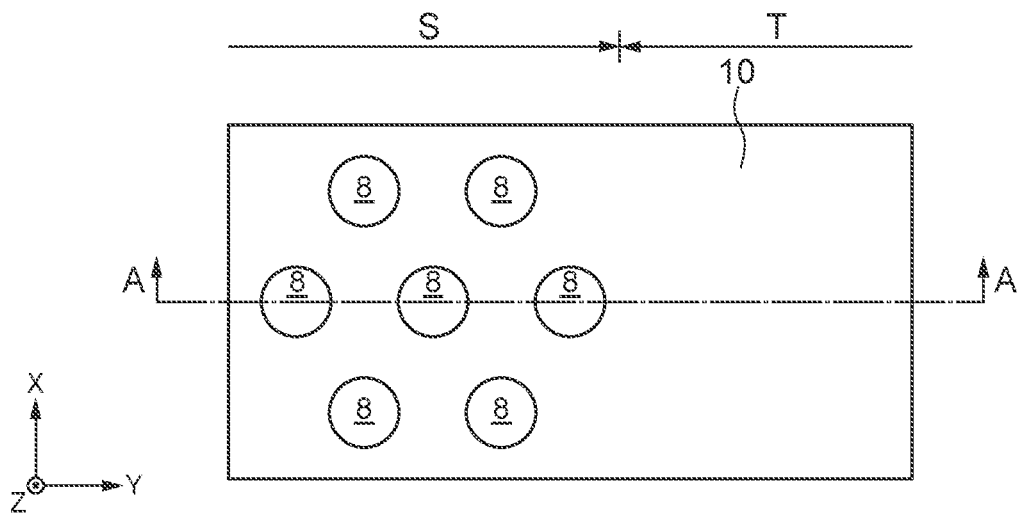
Figure 2B:
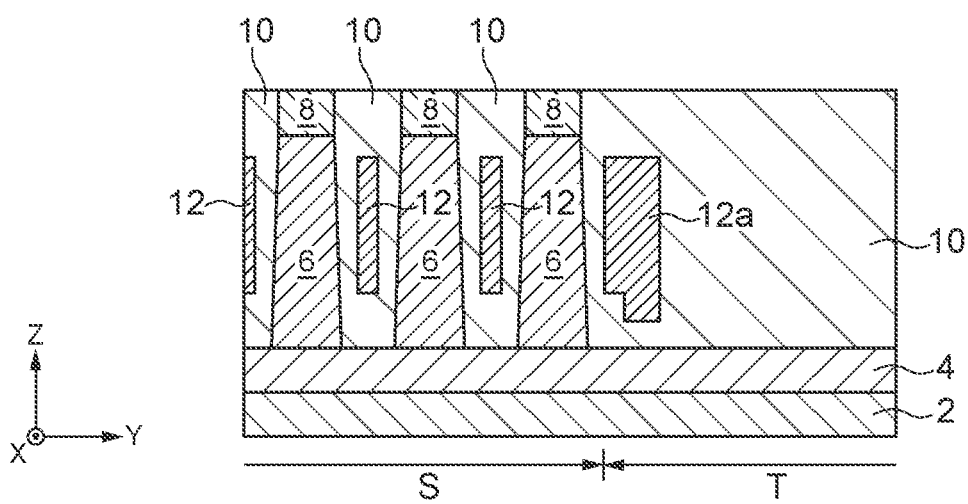

Next, as illustrated in FIG. 2A and FIG. 2B, a second insulating material layer 10 and shield plates 12 are formed in the gaps 9 between the island-shaped structures K. Further, a shield plate 12a is also formed near the boundary between the memory cell region S and the peripheral region T. The shield plate 12a is formed around the memory cell region S. The second insulating material layer 10 contains, for example, a silicon oxide film ($SiO_2$). The shield plates 12 and 12a contain a conductive material, for example, contain polysilicon (poly-Si) doped with phosphorus (P) as impurities. The second insulating material layer 10, and the shield plates 12 and 12a can be formed, for example, by a CVD method. The shield plates 12 and 12a are encompassed by the second insulating material layer 10.

Figure 3A:
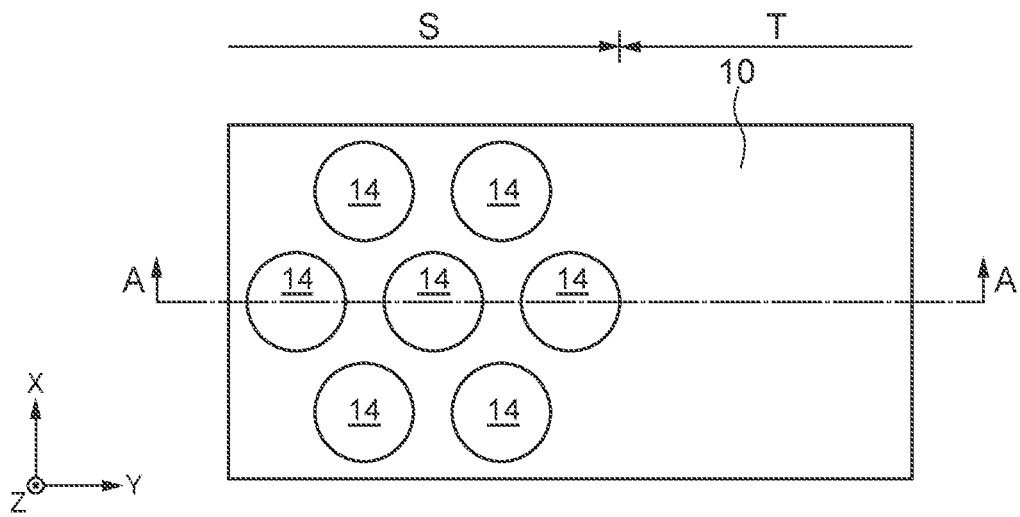
Figure 3B:
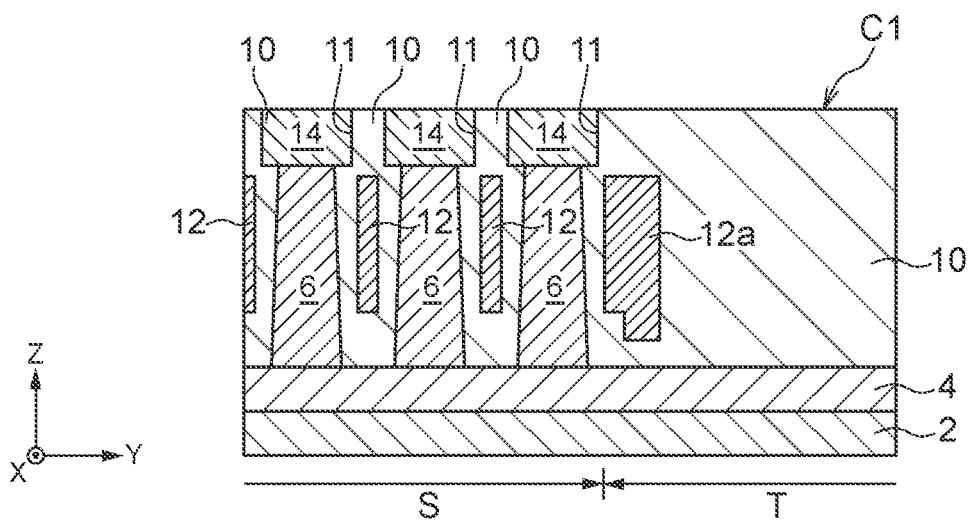

Next, as illustrated in FIG. 3A and FIG. 3B, the patterned first insulating material layers 8 are selectively removed to expose the surfaces of the patterned second semiconductor layers 6. The patterned first insulating material layers 8 can be selectively removed by etching using a hot phosphoric acid solution, for example. Depressions 11 are formed at places where the patterned first insulating material layers 8 are removed. Thereafter, the depressions 11 are expanded by performing isotropic etching on the second insulating material layer 10. As the etching may be performed dry etching or wet etching using, for example, buffered hydrofluoric acid.

Thereafter, conductive material layers 14 are embedded in the depressions 11 which have been formed by removing the first insulating material layers 8. The conductive material layers 14 contain a conductive material, for example, tungsten (W). The conductive material layers 14 are formed, for example, by forming tungsten inside the depressions 11 and on the top surface of the second insulating material layer 10 by CVD and performing anisotropic dry etching until the top surface of the second insulating material layer 10 is exposed, thereby performing etch back. A plane C1 including the surfaces of the conductive material layers 14 and the second insulating material layer 10 is formed. A structure illustrated in FIG. 3A and FIG. 3B is formed by the above steps.

Figure 4A:
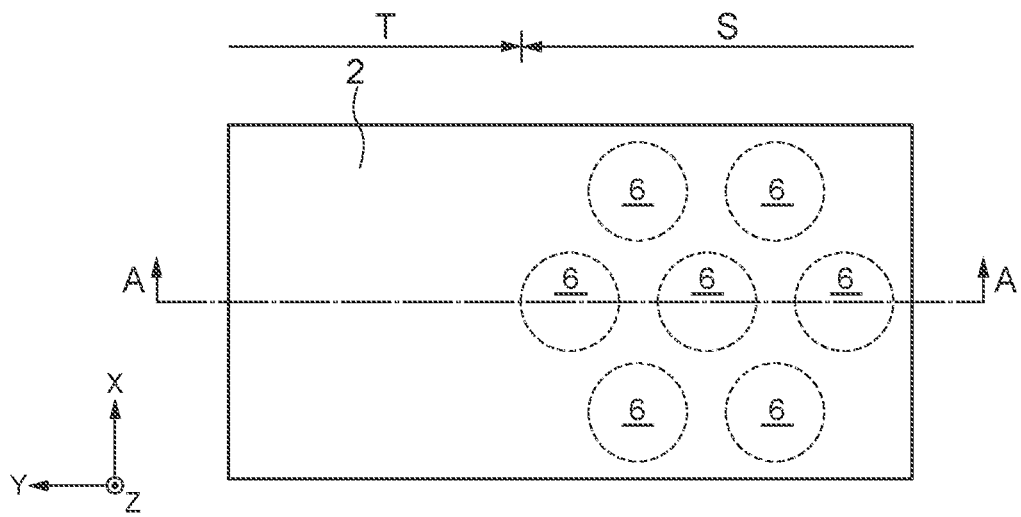
Figure 4B:
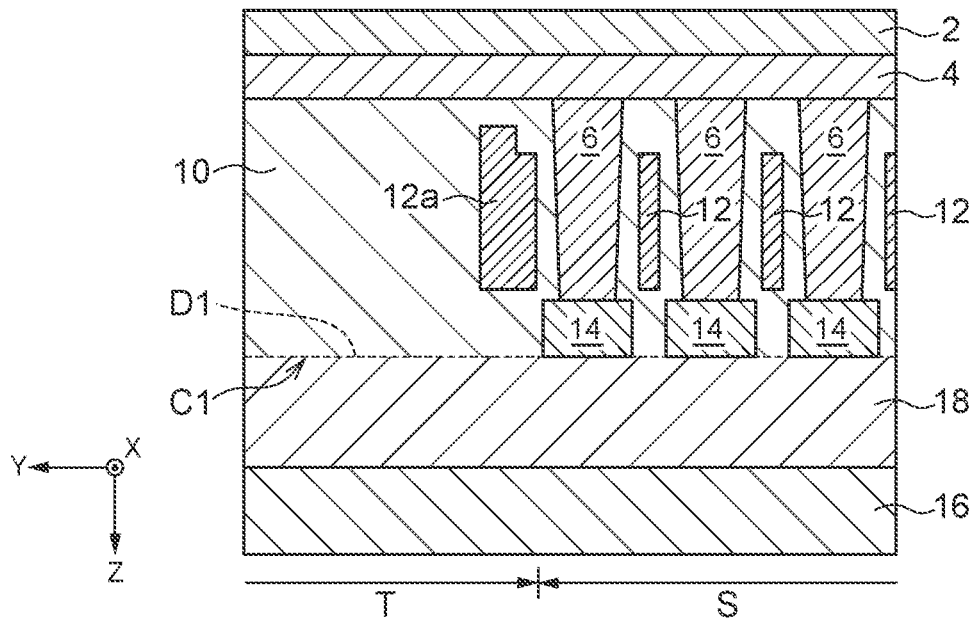

Next, as illustrated in FIG. 4A and FIG. 4B, the first semiconductor substrate 2 is rotated along an X-axis by 180 degrees. Next, by using a wafer bonding technique, the first semiconductor substrate 2 including the patterned second semiconductor layer 6, the second insulating material layer 10, and the patterned conductive material layers 14 is bonded, at a joint surface D1, to a first support substrate 16 on which a third insulating material layer 18 has been formed in advance. At the joint surface D1, the plane C1 containing the surface of the second insulating material layer 10 and the surfaces of the conductive material layers 14 are in contact with the surface of the third insulating material layer 18.

For example, a fusion bonding method can be used in the wafer bonding technique. The fusion bonding method first performs a treatment for causing a large number of hydroxyl groups to adhere to the surface of the first support substrate 16 having the third insulating material layer 18 formed thereon and also to the surface of the first semiconductor substrate 2 including the patterned second semiconductor layers 6, the second insulating material layer 10, and the conductive material layers 14, that is, performs a hydrophilic treatment. Next, the surfaces of both the first support substrate 16 and the first semiconductor substrate 2 which have been hydrophilized are overlapped with and bonded to each other. The bonding based on the fusion bonding method is established by hydrogen bonds between hydroxyl groups on the surfaces that have become hydrophilic. The bonding based on the fusion bonding method can be performed at room temperature.

At this time, the first support substrate 16 and the first semiconductor substrate 2 are overlapped, stacked and bonded while they are positioned. The positioning is performed, for example, by forming alignment marks (not illustrated) in advance on the first support substrate 16 and the first semiconductor substrate 2 and detecting these alignment marks. Other bonding methods may also be used as the wafer bonding technique.

Figure 5A:
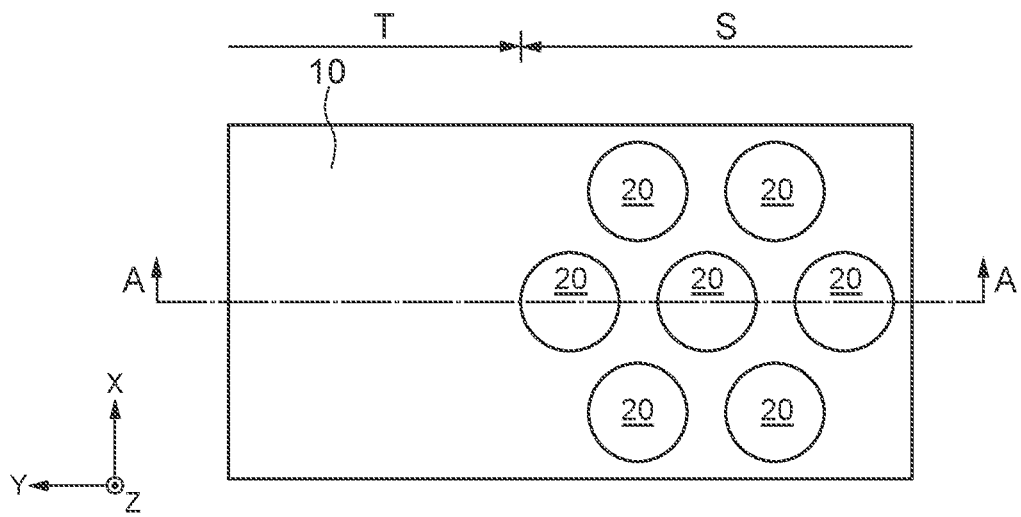
Figure 5B:
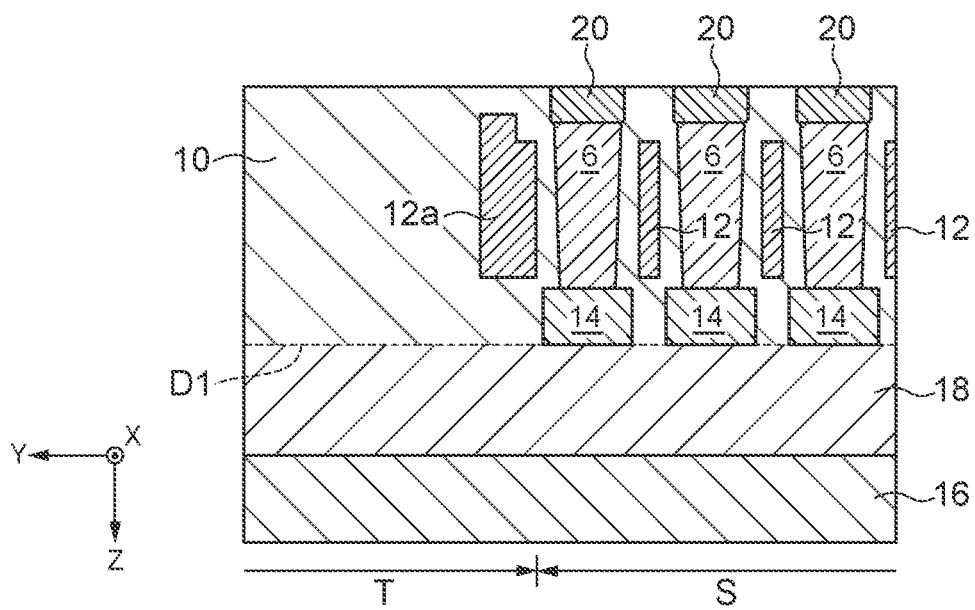

Next, as illustrated in FIG. 5A and FIG. 5B, the first semiconductor substrate 2 and the first semiconductor layer 4 are removed. The removal of the first semiconductor substrate 2 and the first semiconductor layer 4 can be performed by chemical mechanical polishing (hereinafter referred to as CMP) and dry etching. By removing the first semiconductor substrate 2 and the first semiconductor layer 4, the surfaces of the patterned second semiconductor layers 6 are exposed. Next, impurities are doped in parts of the patterned second semiconductor layers 6. The impurities include, for example, at least one of phosphorus (P), arsenic (As), or boron (B). The impurities are introduced, for example, by ion implantation. After the impurities are introduced, a heat treatment is performed to activate the impurities. The heat treatment is carried out, for example, at a temperature of 1050° C. in an atmosphere of an inert gas such as nitrogen by using a lamp annealing device. As a result, first doped layers 20 are formed on a part of the second semiconductor layer 6.

Figure 6A:
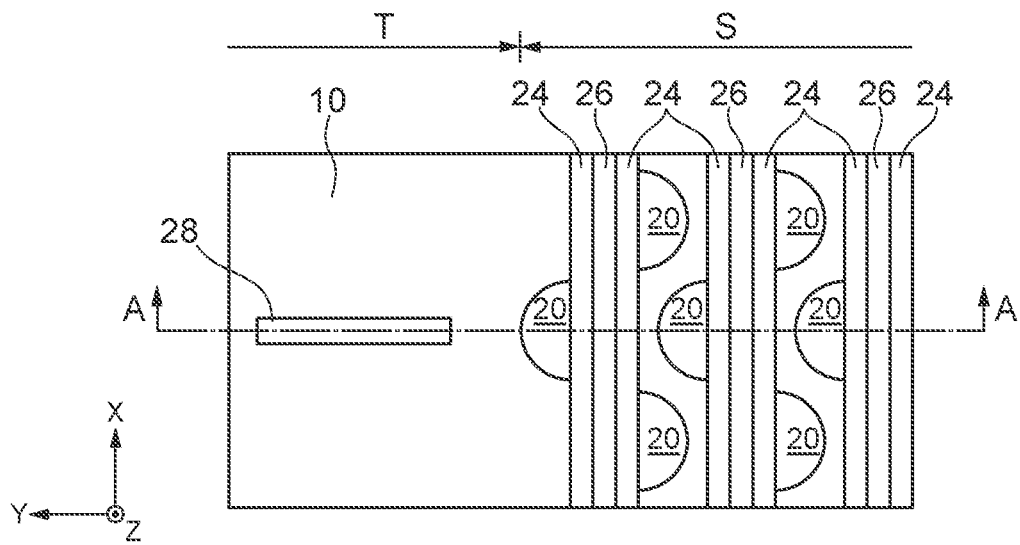
Figure 6B:
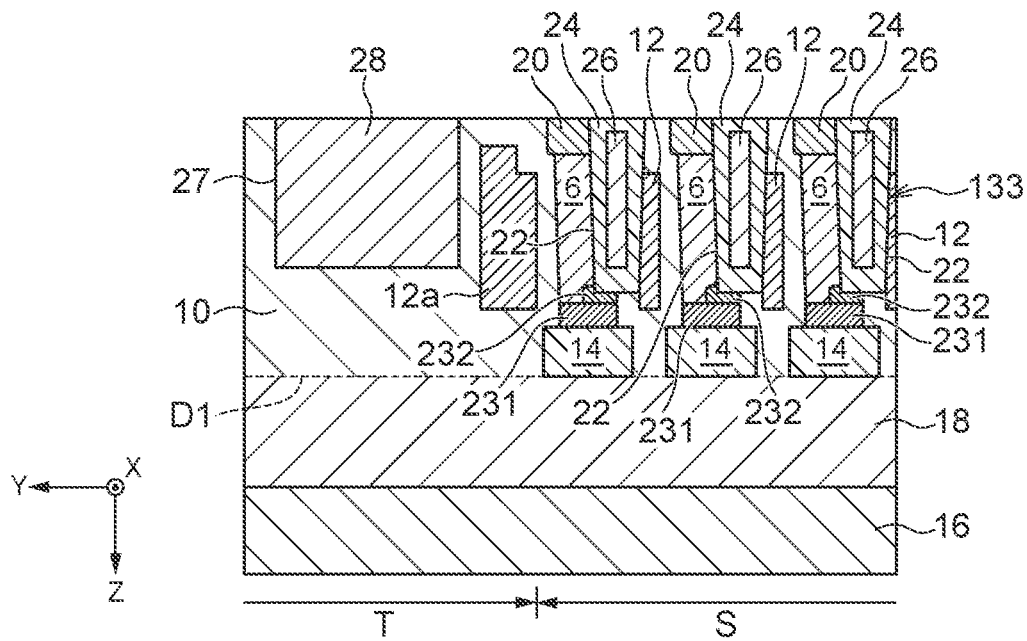

Next, as illustrated in FIG. 6A and FIG. 6B, grooves 22 are formed between the patterned second semiconductor layers 6 and the shield plates 12 in a direction from the first doped layer 20 side to the conductive material layer 14 side. The grooves 22 are formed so as to extend in a Z-direction, and are formed at a depth that does not reach the conductive material layers 14. Further, a groove 27 is formed in the peripheral region T in the same step as the formation of the grooves 22. The formation of the grooves 22 and 27 can be performed by using a known lithography technique and an anisotropic dry etching technique.

Thereafter, ion implantation is performed to implant, for example, at least one of phosphorus, arsenic, or boron impurities into the patterned second semiconductor layers 6 located at the bottom portions of the grooves 22, and then a heat treatment is performed to activate the impurities. The heat treatment is carried out, for example, at a temperature of 1050° C. in an atmosphere of an inert gas such as nitrogen by using a lamp annealing device, thereby forming second doped portions 231 and third doped portion 232. In the formation of the second doped portions 231 and the third doped portions 232, ion implantation is performed by using different implantation energies.

The second doped portion 231 and the third doped portion 232, and the first doped layer 20 function as source-drain region of an access transistor 133 which is a vertical transistor described later. The second semiconductor layer 6 functions as a channel region of the access transistor 133. The third doped portion 232 functions as an extension portion of the source-drain region of the access transistor 133.

The patterned second semiconductor layers 6 functions as channel regions of the access transistors 133. The patterned second semiconductor layers 6 are surrounded by an insulating film except for connection portions thereof with the first semiconductor layer 4 and the conductive material layers 14. The access transistor 133 functions as a complete depletion type or partial depletion type SOI transistor. The shield plates 12 and the shield plate 12a are connected to a predetermined potential and function as element isolation for electrically separating the access transistors 133.

In DRAM, the source and drain of the access transistor are interchanged by each other between a data writing operation and a data reading operation. Therefore, a pair of a source region and a drain region of a transistor are referred to as a source-drain region.

In the heat treatment for activating the impurities doped in the first doped layers 20, the second doped portions 231 and the third doped portions 232 described above, tungsten silicide (WSi) is formed between the conductive material layer 14 and the second semiconductor layer 6.

Next, a gate insulating film 24 and a gate-electrode 26 are formed in each groove 22. The gate insulating film 24 contains, for example, silicon dioxide. The gate-electrode 26 contains a conductive material, for example, contains titanium nitride. In a longitudinal section illustrated in FIG. 6B, the gate-electrode 26 is surrounded by the gate insulating film 24. The gate insulating films 24 and the gate-electrodes 26 are formed, for example, by forming silicon dioxide and titanium nitride in the grooves 22 by the CVD method, performing etch back by anisotropic dry etching, and then embedding silicon dioxide in depressions which are formed on the gate-electrodes 26 by etch back. In this way, the gate-electrodes 26 can be formed so as to face and contact the side surfaces of the patterned second semiconductor layers 6 serving as the channel regions through the gate insulating films 24.

Further, the groove 27 and a pull-out-electrode 28 are formed in the same step as the formation of the grooves 22 and the gate-electrodes 26. The pull-out-electrode 28 is formed of the same material as the gate-electrodes 26. The same insulating film as the gate insulating films 24 formed in the grooves 22 is also formed on the side surface in the groove 27, but it is omitted from the illustration of FIG. 6B and the like because it is integrated with the second insulating material layer 10. The pull-out-electrode 28 is formed, for example, by forming silicon dioxide and titanium nitride in the groove 27 by the CVD method and performing etch back by anisotropic dry etching in the same step as the formation of the gate-electrodes 26.

Here, the etch back is performed in a state where a patterned resist (not illustrated) has been formed on the pull-out-electrode 28. The resist is patterned by a known lithography technique. After removing the resist, additional etch back may be performed. In this way, the top surface of the pull-out-electrode 28 is adjusted to be higher than the top surfaces of the gate-electrodes 26. Further, this etch back adjusts the heights from the top surface of the first support substrate 16 to the top surfaces of the first doped layers 20 and the top surface of the pull-out-electrode 28 so that the heights are substantially equal to one another in FIG. 6B.

Further, depressions are formed on the gate-electrodes 26 by this etch back. Thereafter, silicon dioxide is embedded in the depressions formed on the gate-electrodes 26. A structure in which the upper portions of the gate-electrodes 26 are covered with an insulating film and the top surface of the pull-out-electrode 28 is exposed is formed by the above step. A structure illustrated in FIG. 6A and FIG. 6B is formed through the above steps.

Figure 7A:
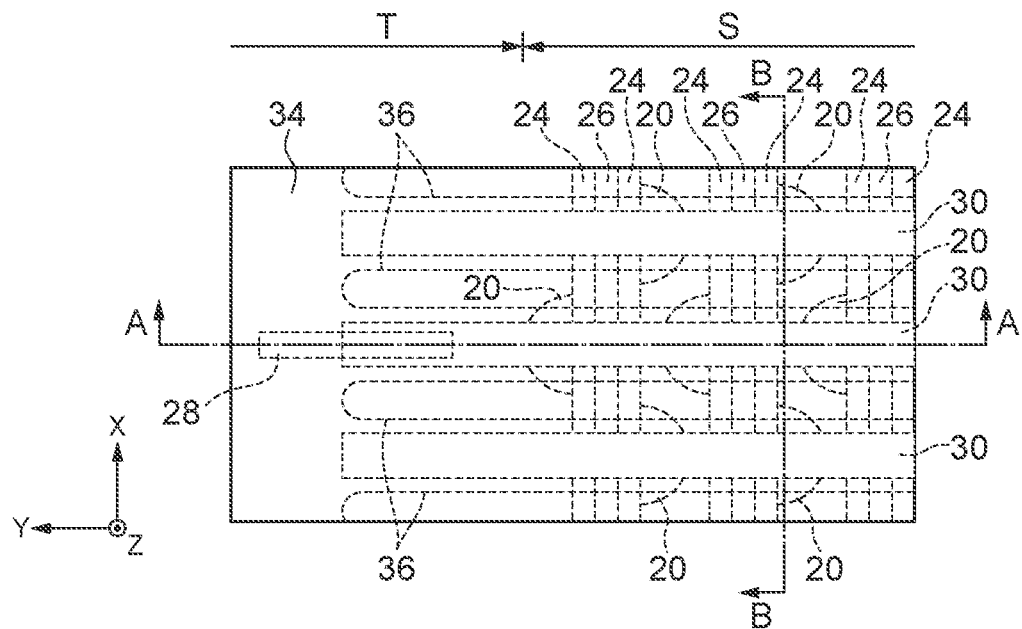
Figure 7B:
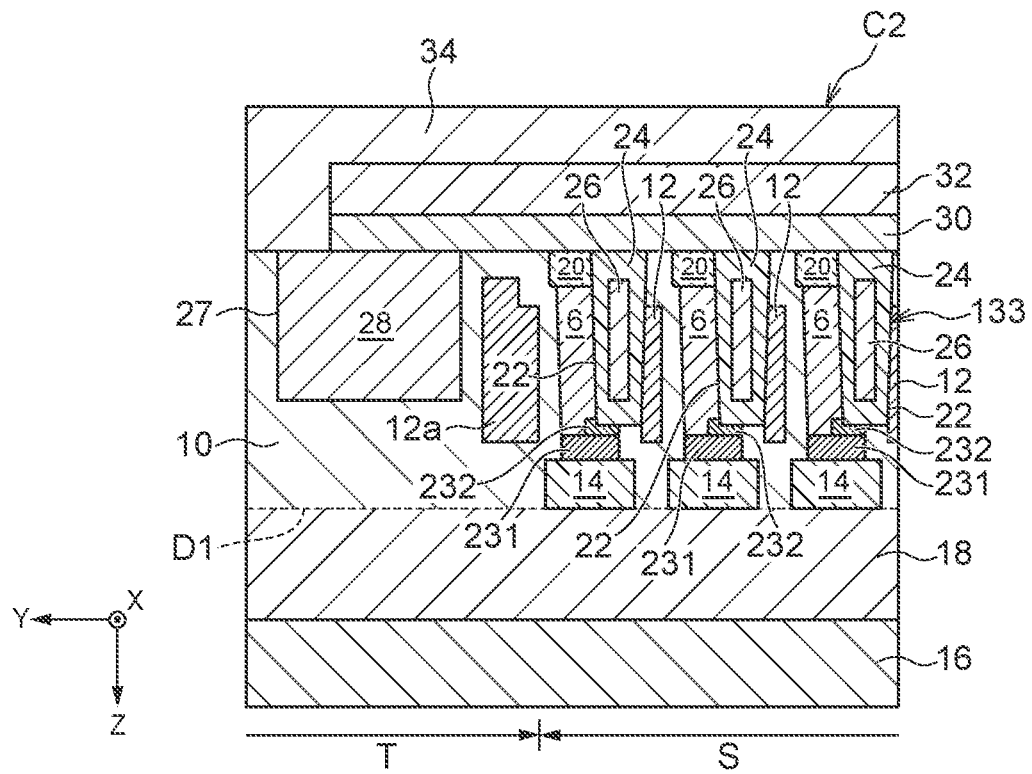
Figure 7C:
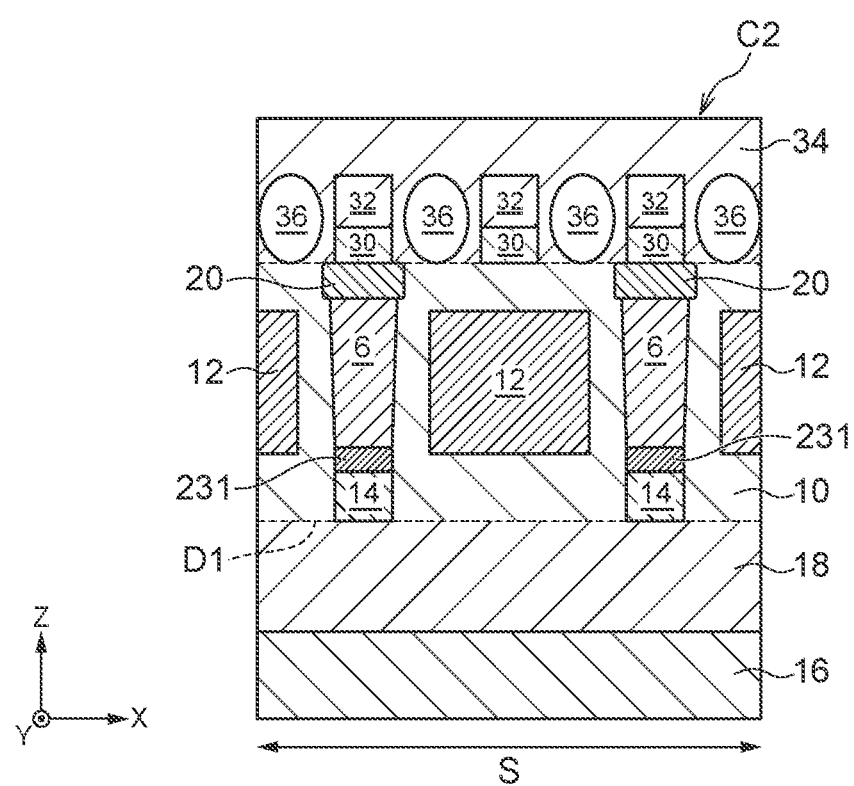

Next, as illustrated in FIG. 7A, FIG. 7B and FIG. 7C, a plurality of bit-lines 30 extending in the Y-direction are formed. The bit-lines 30 include, for example, a conductive material containing at least any material of tungsten silicide (WSi), tungsten nitride (WN), and tungsten (W). The bit-lines 30 are in contact with the first doped layers 20 and the pull-out-electrode 28, and are electrically connected to the first doped layers 20 and the pull-out-electrode 28. On-bit-line insulating films 32 are provided on the bit-lines 30, and a fourth insulating material layer 34 is formed so as to cover the bit-lines 30 and the on-bit-line insulating films 32. The on-bit-line insulating films 32 contains an insulating material, for example, silicon nitride. The fourth insulating material layer 34 contains an insulating material, for example, silicon dioxide.

The bit-lines 30 and the on-bit-line insulating films 32 are formed by the following step. First, a conductive material and an insulating film are formed on the first doped layers 20, the pull-out-electrode 28, and the second insulating material layer 10, for example, by CVD. Subsequently, known lithography and anisotropic dry etching are performed on the conductive material and the insulating film. The bit-lines 30 and the on-bit-line insulating films 32 are formed by the above step.

The fourth insulating material layer 34 is formed, for example, by CVD. The film formation of the fourth insulating material layer 34 is carried out under a condition that coverage is poor. The fourth insulating material layer 34 is formed, for example, by plasma CVD. When the fourth insulating material layer 34 is formed under the condition that coverage is poor, the fourth insulating material layer 34 is not completely embedded in the gaps between the bit-lines 30 and between the on-bit-line insulating films 32, and thus the gaps become hollow, so that air gaps 36 are formed. The air gaps 36 are arranged between the bit-lines 30, whereby the interwire capacitance between the bit-lines 30 can be reduced.

Further, a plane C2 including the surface of the fourth insulating material layer 34 is formed. A structure illustrated in FIG. 7A, FIG. 7B and FIG. 7C are formed by the above step. Here, the member including the second insulating material layer 10, the patterned second semiconductor layers 6, the conductive material layers 14, the first doped layers 20, the second doped portions 231 and the third doped portions 232, the bit-lines 30 and the like is referred to as a first member H.

Figure 8A:
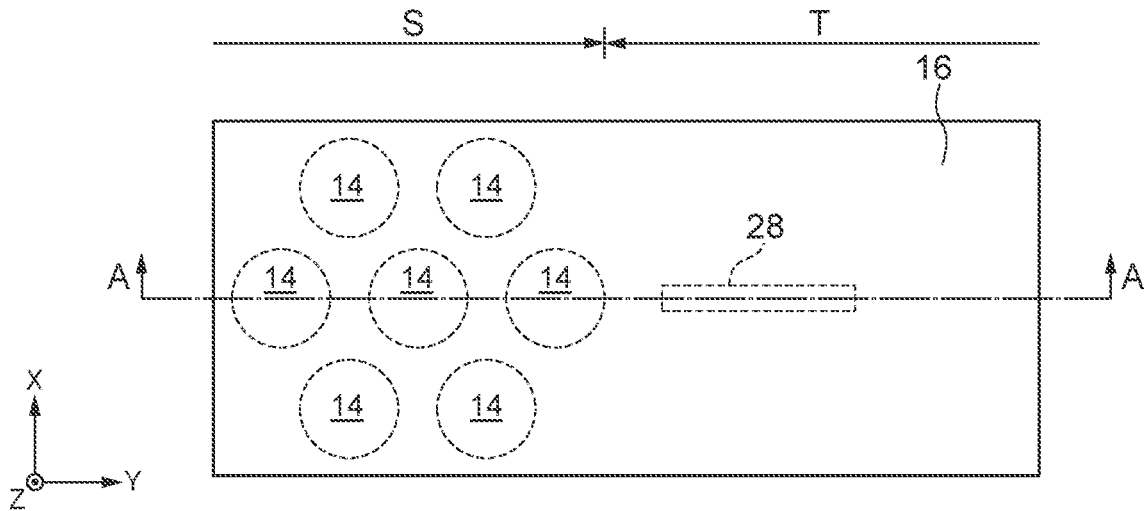
Figure 8B:
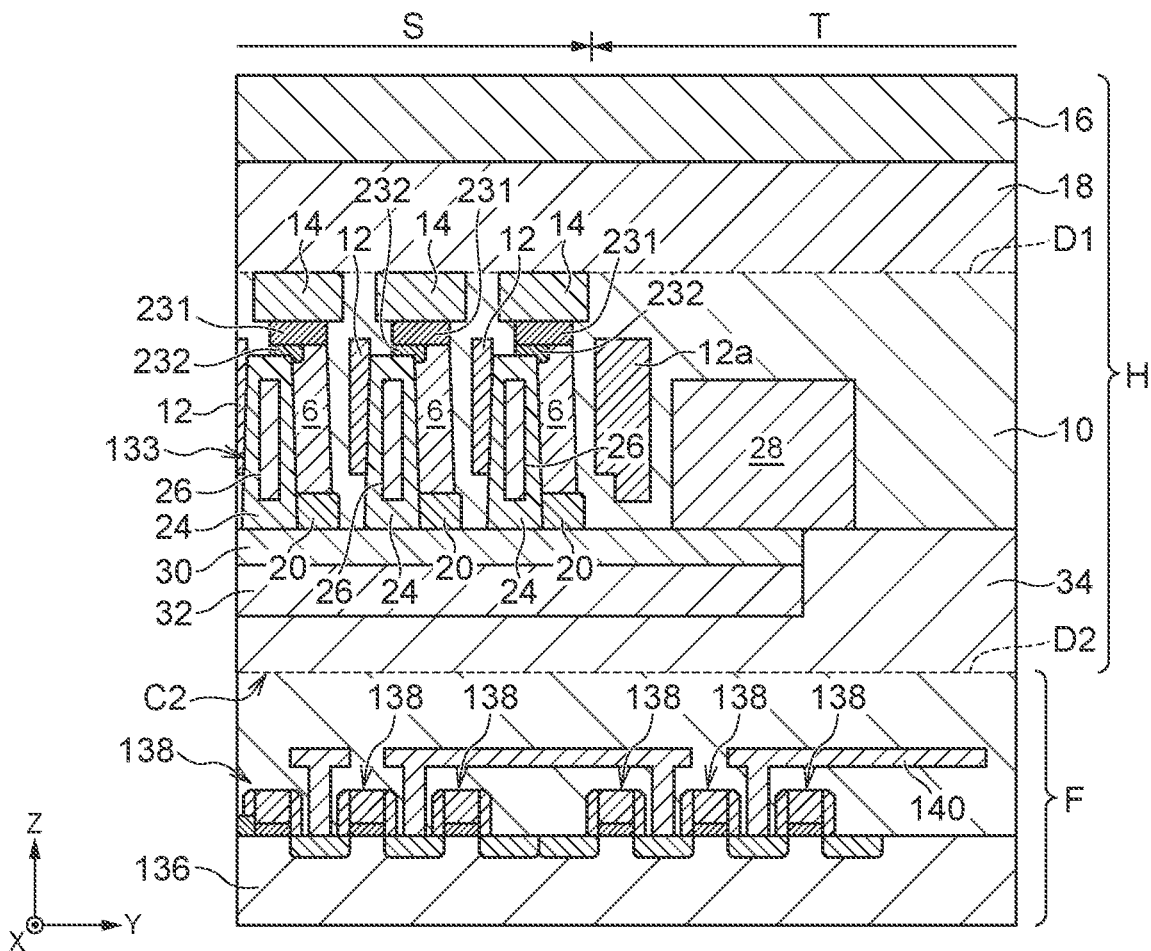

Next, as illustrated in FIG. 8A and FIG. 8B, the front and back sides or top and bottom sides of the first member H are inverted. Next, a second member F including a second semiconductor substrate 136, peripheral circuit transistors 138, wirings 140, and the like is prepared. In the second member F, the peripheral circuit transistors 138, the wirings 140 and the like are formed in advance, and a heat treatment for activating impurities doped in the sources and drains of peripheral circuit transistors 138 has been performed before the bonding based on the wafer bonding technique is performed. The first member H and the second member F are bonded to each other by the wafer bonding technique. For example, a fusion bonding method can be used in the wafer bonding technique. The first member H and the second member F are bonded to each other at a joint surface D2. At the joint surface D1, the plane C2 including the surface of the fourth insulating material layer 34 is in contact with the surface of the second member F.

Figure 9A:
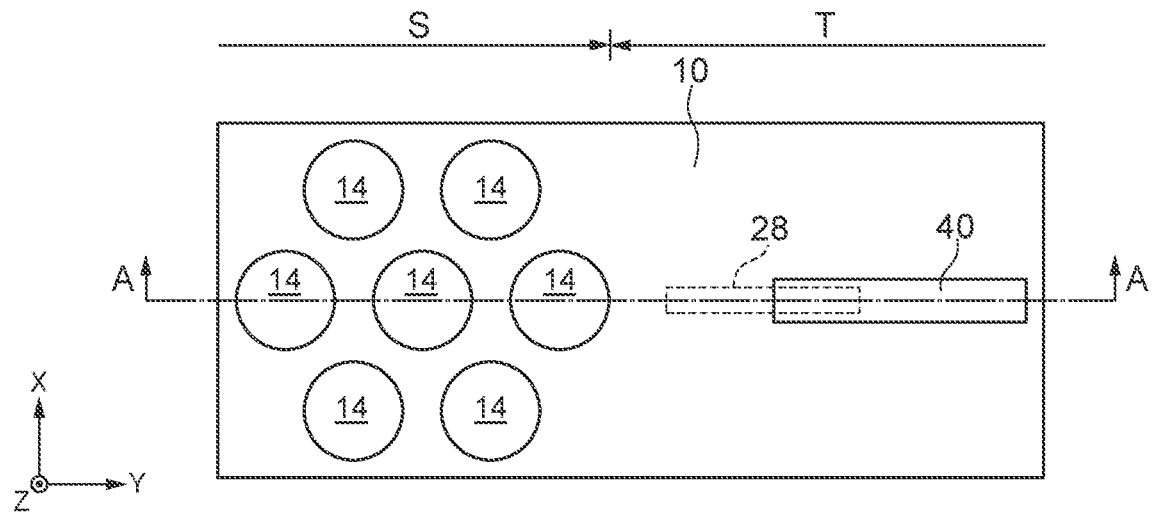
Figure 9B:
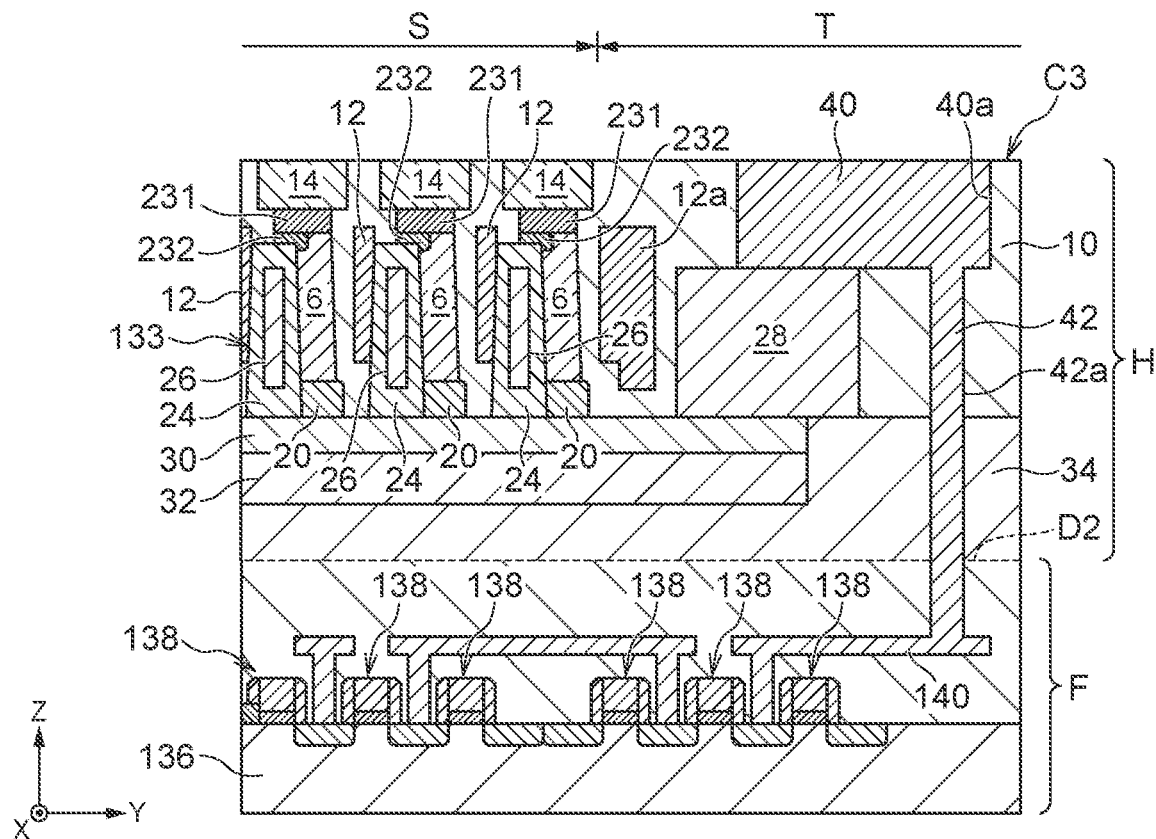

Next, as illustrated in FIG. 9A and FIG. 9B, the first support substrate 16 and the third insulating material layer 18 are removed. The first support substrate 16 and the third insulating material layer 18 can be removed, for example, by CMP, etching or the like. The surfaces of the second insulating material layer 10 and the conductive material layers 14 are exposed by removing the first support substrate 16 and the third insulating material layer 18. The first member H has a structure in which the first support substrate 16 and the third insulating material layer 18 are removed. Next, a known lithography method and anisotropic dry etching are performed to form a groove 40a extending from the surface of the second insulating material layer 10 to the surface of the pull-out-electrode 28 in the peripheral region T. The groove 40a is formed by performing the known lithography method and the anisotropic dry etching.

Next, a contact hole 42a that reaches the wiring 140 of the second member F is formed. The contact hole 42a is formed by performing the known lithography method and the anisotropic dry etching. Here, the order of forming the groove 40a and the contact hole 42a can be reversed. Next, a contact electrode 42 and a pull-out-electrode 40 are formed by embedding a conductive material in the contact hole 42a and the groove 40a. The conductive material contains, for example, tungsten, and is formed, for example, by CVD. A plane C3 including the surface of the second insulating material layer 10, the surfaces of the conductive material layers 14, and the surface of the pull-out-electrode 40 is formed.

An example in which the pull-out-electrode 40 and the contact electrode 42 are formed by using a so-called dual damascene technique is described above, but they may be formed by using a single damascene technique. In this way, the bit-lines 30, the pull-out-electrode 28, the pull-out-electrode 40, the contact electrode 42, and the wiring 140 are electrically connected to one another. A structure illustrated in FIG. 9A and FIG. 9B is formed by the above step. The first member H has a structure including the access transistors 133, the bit-lines 30, the conductive material layers 14, the pull-out-electrode 40, the plane C3, and the like.

Here, if the pull-out-electrode 28 and the gate-electrodes 26 are not formed in the same step, contact holes would be formed in the bit-lines 30 after the bit-lines 30 are formed. At this time, the contact holes may be connected to the air gaps 36, which may cause, for example, a short circuit with an adjacent bit-line 30. By forming the pull-out-electrode 28 and the gate-electrodes 26 in the same step, the contact holes can be formed away from the air gaps 36, so that the short circuit between the contact hole and the adjacent bit-line 30 can be avoided.

Figure 10A:
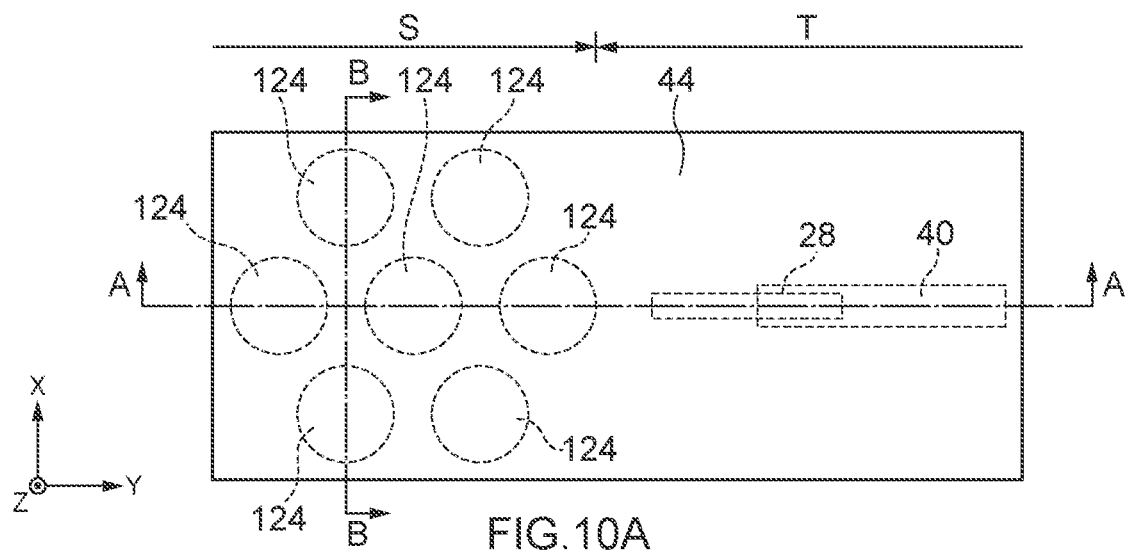
Figure 10B:
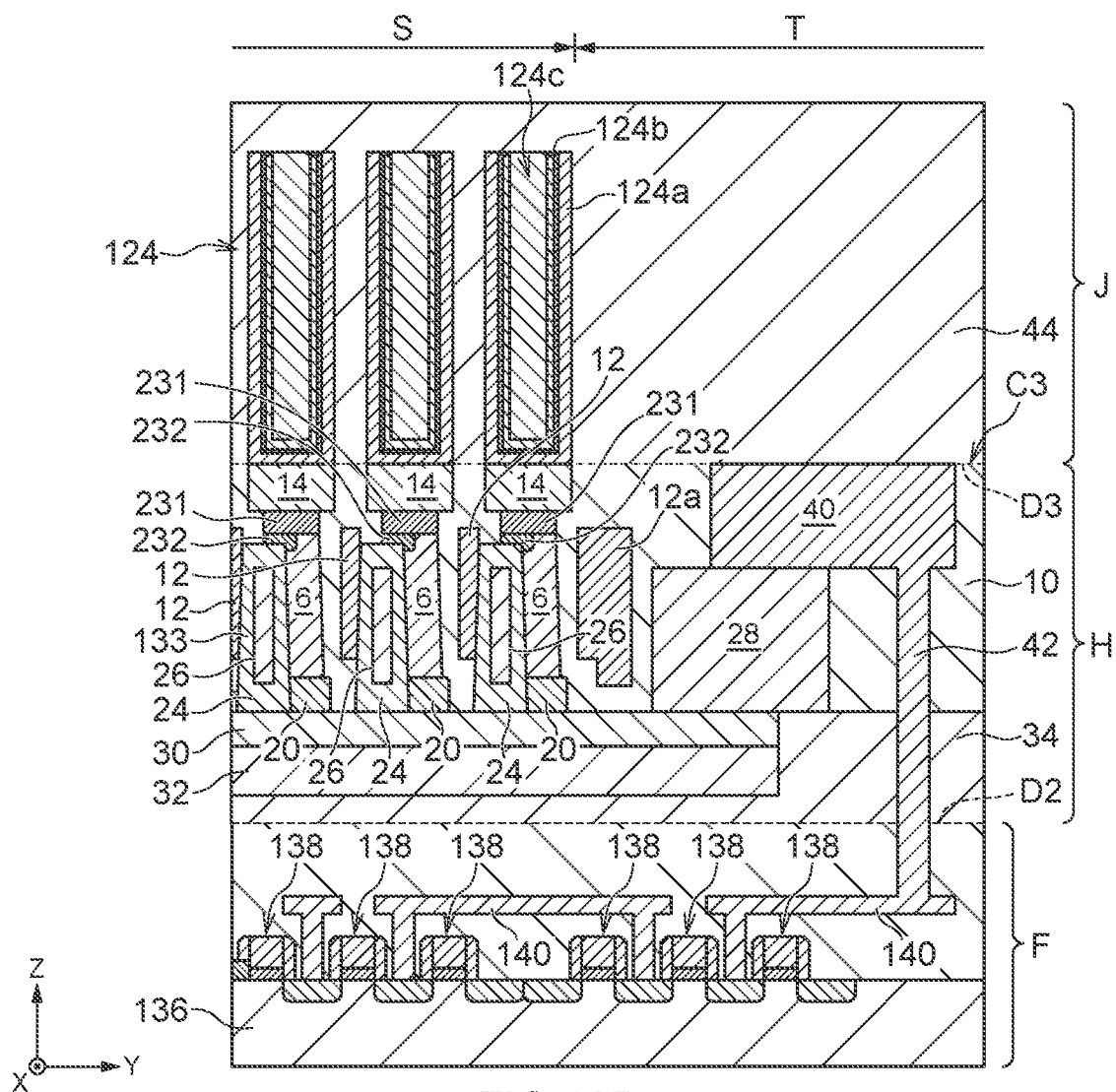
Figure 10C:
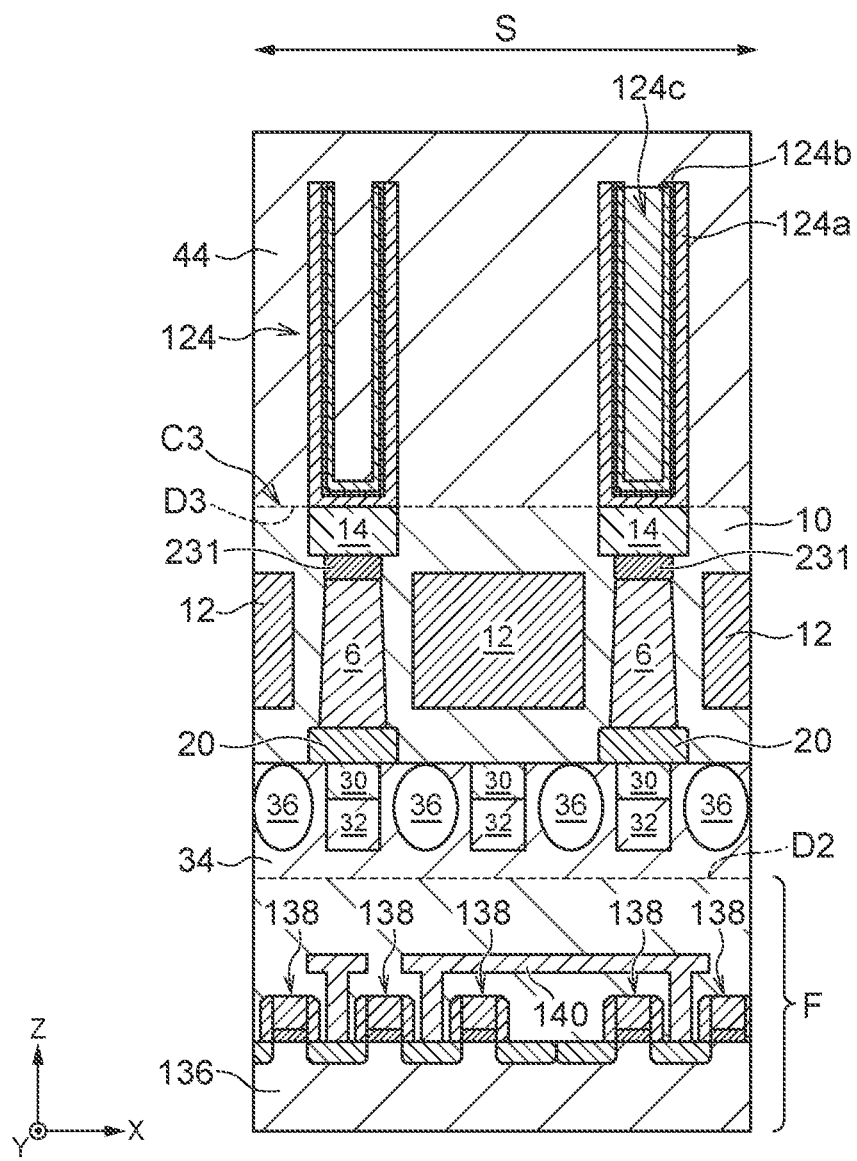

Next, as illustrated in FIG. 10A, FIG. 10B and FIG. 10C, a third member J in which storage capacitors 124 have been formed in advance and the first member H are bonded to each other at a joint surface D3 by the wafer bonding technique. For example, the fusion bonding method can be used in the wafer bonding technique. At the joint surface D3, the plane C3 of the first member H and the bottom surface of the third member J are in contact with each other. The third member J includes the storage capacitors 124. The storage capacitor 124 includes a first electrode 124a, a capacitive insulating film 124b, and a second electrode 124c.

The capacitive insulating film 124b includes, for example, a high-k film having a high relative permittivity, and contains, for example, metal oxide such as hafnium oxide ($HfO_2$), zirconium oxide ($ZrO_2$), or aluminum oxide ($Al_2O_3$). The capacitive insulating film 124b is formed, for example, by CVD. The first electrode 124a and the second electrode 124c include a conductive material, and contains, for example, titanium nitride (TiN). The first electrode 124a and the second electrode 124c are formed, for example, by CVD. The capacitive insulating film 124b is interposed between the first electrode 124a and the second electrode 124c, and these elements function as a capacitor and is capable of storing and discharging electric charges. The first electrode 124a is in contact with the conductive material layer 14. The second electrode 124c is connected to a plate electrode (not shown). The storage capacitors 124 are covered with a fifth insulating material layer 44.

A memory cell array including the bit-lines 30, the gate-electrodes 26, the access transistors 133, and the storage capacitors 124 is formed by the above steps. In FIG. 10B, the heights from the top surface of the second semiconductor substrate 136 to the surfaces of the first doped layers 20 (e.g., source-drain region) and the surface of the pull-out-electrode 28 on the bit-line 30 side are substantially the same. This memory cell array corresponds to a memory cell structure E illustrated in FIG. 11 described later.

Figure 11:
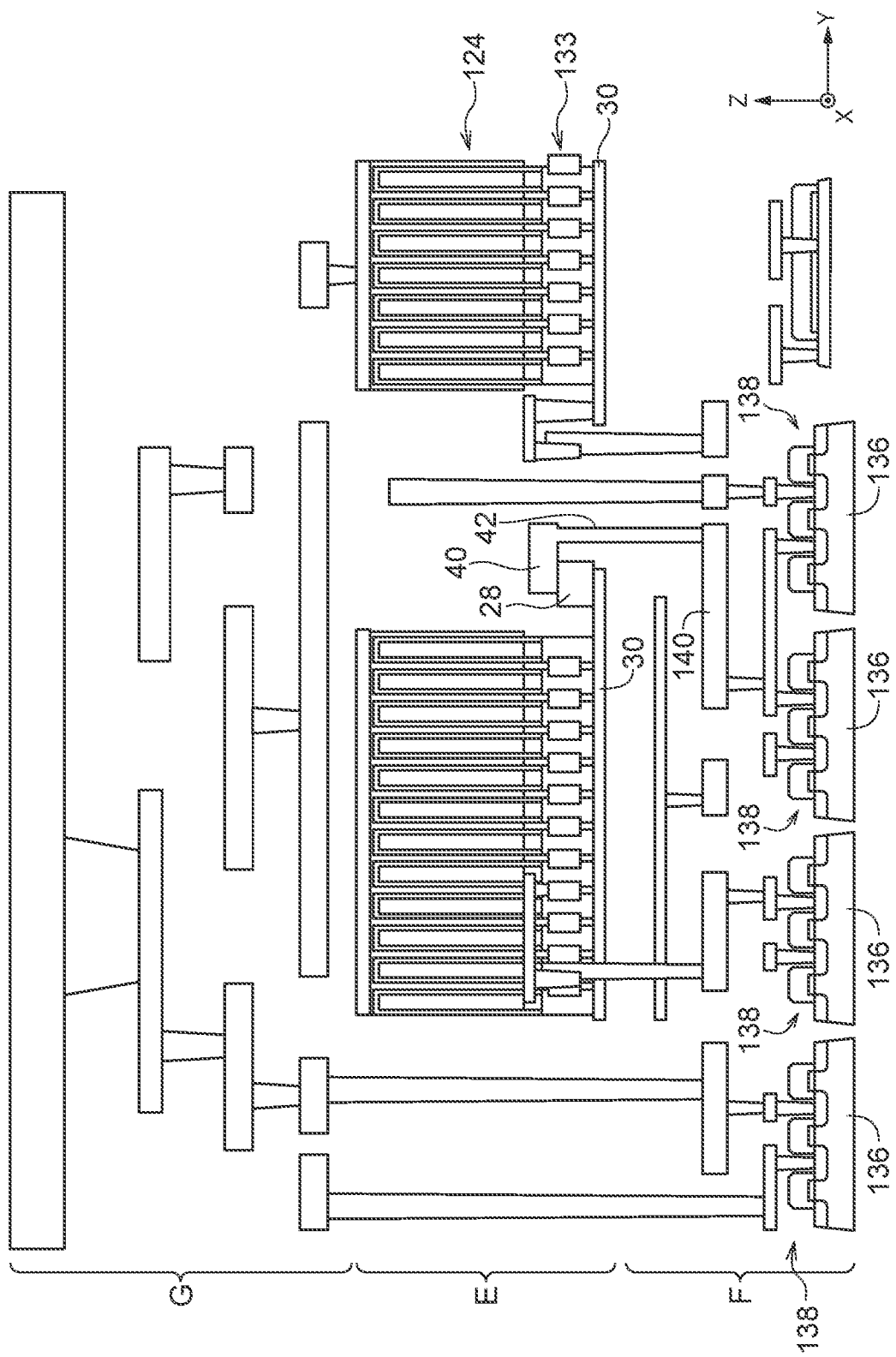
FIG. 11 is a longitudinal section illustrating a schematic overall configuration of a semiconductor device according to the first and second embodiments.

FIG. 11 is a longitudinal section illustrating an outline of the overall configuration of the semiconductor device including the memory cell structure E. As illustrated in FIG. 11, the semiconductor device includes the memory cell structure E, the second member F, and a wiring portion G. FIG. 11 is a longitudinal section illustrating the outline of the overall configuration of the semiconductor device according to the first embodiment and a second embodiment described later.

The memory cell structure E constitutes a memory cell portion of the semiconductor device, and includes a plurality of bit-lines 30, a plurality of access transistors 133, and a plurality of storage capacitors 124. The memory cell structure E illustrated in FIG. 11 corresponds to the structure in which the first member H and the third member J described above are bonded to each other. The access transistor 133 includes the gate-electrode 26 (word-line) as illustrated in FIG. 10B.

The second member F has a peripheral circuit for driving the memory cell. The peripheral circuit includes, for example, peripheral circuit transistors 138 formed on the second semiconductor substrate 136. The surface of the second semiconductor substrate 136 forms a plane parallel to the X-Y plane, and the peripheral circuit transistors 138 are formed on the surface of the second semiconductor substrate 136. The wiring portion G includes a wiring layer containing a plurality of wirings.

In the semiconductor device according to the embodiment, the second member F, the memory cell structure E, and the wiring portion G are arranged so as to be stacked in the Z-direction. The access transistors 133 extend so that the channel direction thereof is vertical to the second semiconductor substrate 136. The longitudinal direction of the storage capacitors 124 is vertical to the second semiconductor substrate 136. Therefore, it is possible to reduce a planar area to be occupied by the memory cell and the peripheral circuit, and thus it is possible to reduce a chip area of the semiconductor device. Therefore, it is possible to provide a semiconductor device with reduced cost.

Figure 12:
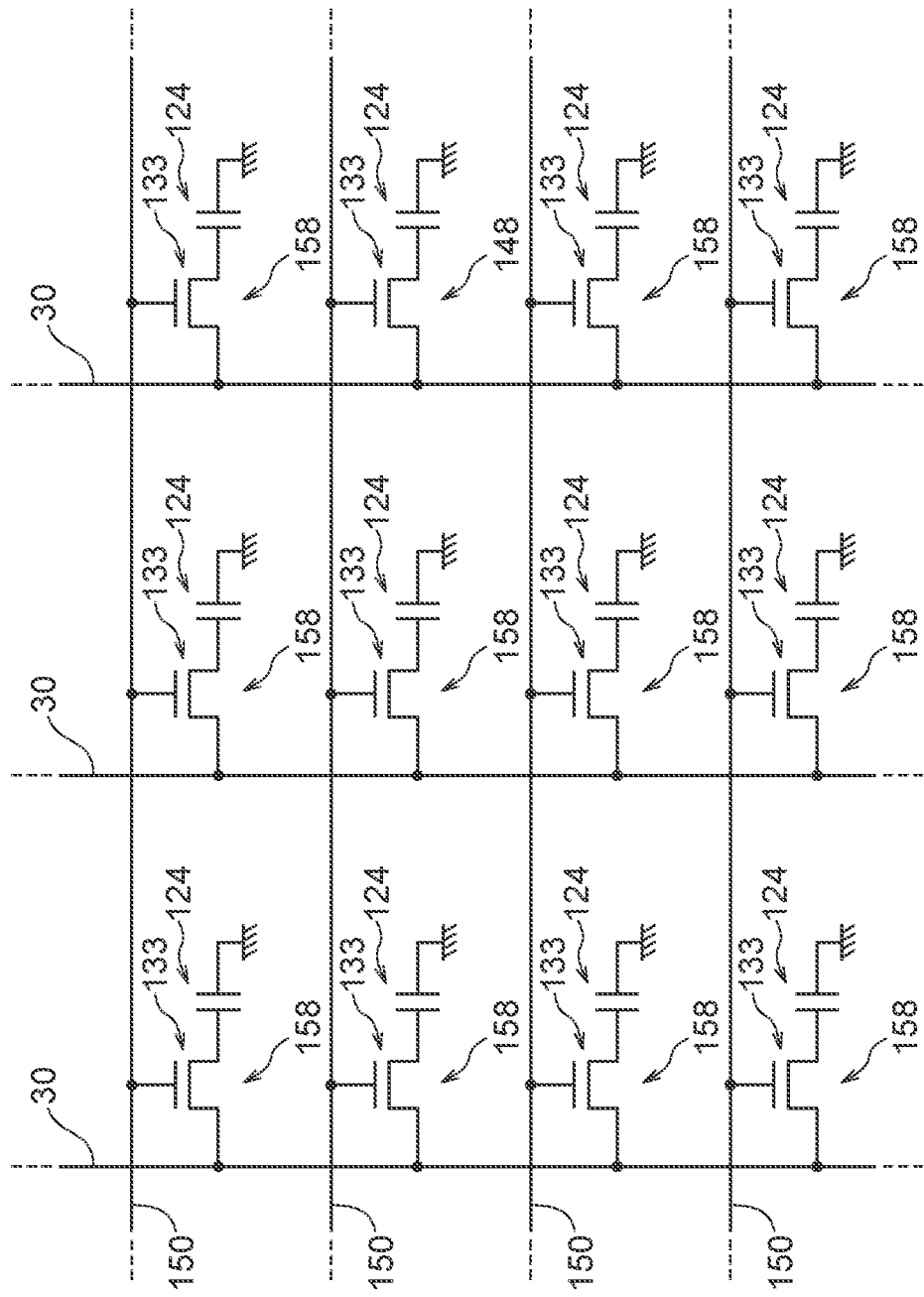
FIG. 12 is a circuit diagram illustrating a schematic configuration of an equivalent circuit of a memory cell of the semiconductor device according to the first and second embodiments.

FIG. 12 illustrates an equivalent circuit of the memory cell array of the semiconductor device according to the first embodiment and the second embodiment described later. A plurality of memory cells 158 are arranged in a matrix so as to be connected to the intersections of the plurality of word-lines 150 and the plurality of bit-lines 30 which are arranged so as to cross at right angles. One memory cell 158 includes a pair of access transistors 133 and a storage capacitor 124.

The access transistor 133 includes, for example, MOSFET. The gate-electrode 26 of the access transistor 133 functions as the word-line 150 of DRAM. The word-line 150 functions as a control line for controlling selection of the corresponding memory cell. One of the source and drain of the access transistor 133 is connected to the bit-line 30, and the other is connected to the storage capacitor 124. The storage capacitor 124 includes a capacitor, and electric charges are accumulated in the capacitor to store data.

When data are written into the memory cell 158, a potential for turning on the access transistor 133 is applied to the word-line 150, and a low potential or high potential which corresponds to writing data "0" or "1" is applied to the bit-line 30. When data are read out from the memory cell 158, a potential for turning on the access transistor 133 is applied to the word-line 150. As a result, the potential drawn from the storage capacitor 124 to the bit-line 30 is sensed by a sense amplifier connected to the bit-line 30, thereby performing data determination.

Through the above steps, it is possible to form the semiconductor device including the access transistors 133 each containing the first doped layer 20, the second semiconductor layer 6, the second doped portion 231 and the third doped portion 232 which are arranged side by side in the Z-direction. The access transistor 133 is formed as a vertical metal-oxide-semiconductor field-effect transistor (hereinafter referred to as MOSFET) which is formed so that the channel region formed in the second semiconductor layer 6 extends in the Z-direction, that is, the vertical direction. Here, a transistor in which a channel region is formed in the vertical direction and source and drain regions are arranged in the vertical direction at upper and lower sides the channel region is referred to as a vertical transistor.

Through the above steps, it is possible to implement a structure in which the access transistors 133 and the storage capacitors 124 are arranged to be vertically stacked in the Z-direction. By arranging in this way, the area to be occupied by the memory cells on the X-Y plane can be reduced, so that a highly integrated semiconductor device can be realized.

The heat treatment for activating the impurities doped in the first doped layers 20, the second doped portions 231 and the third doped portions 232 is performed before the first member H and the third member J are bonded to each other by the wafer bonding technique. The heat treatment for activating the impurities doped in the sources and drains of the peripheral circuit transistors 138 of the second member F is performed before the first member H and the second member F are bonded to each other by the wafer bonding technique. Therefore, the above heat treatment is not performed on the capacitive insulating films 124b of the storage capacitors 124. As a result, the film quality of the capacitive insulating films 124b do not change, so that it is possible to suppress an increase in the leakage current of the capacitive insulating films 124b.

In the first embodiment, the bonding between the first member H and the second member F by the wafer bonding technique and the bonding between the first member H and the third member J by the wafer bonding technique are performed, that is, the bonding is performed twice. As a result, a strain which has occurred between the first member H and the second member F by the first bonding is canceled by the second bonding, that is, the bonding between the first member H and the third member J. As a result, the positional displacement of patterns formed in the first member H, the second member F, and the third member J is suppressed, so that the yield of the semiconductor device according to the first embodiment is improved.

Next, a semiconductor device according to a second embodiment will be described with reference to FIG. 13 to FIG. 22. Further, FIG. 1B to FIG. 10B, FIG. 7C and FIG. 10C are also referred to. FIGS. 13 to 22 are diagrams illustrating a schematic configuration the semiconductor device according to the second embodiment and a forming method thereof. FIG. 13 to FIG. 22 are plan views illustrating the schematic configuration of the semiconductor device in an exemplary process stage. FIG. 1B to FIG. 10B, FIG. 7C, and FIG. 10C are longitudinal sections illustrating a schematic configuration of a memory cell region in an exemplary process stage corresponding to FIG. 13 to FIG. 22. FIG. 1B to FIG. 10B are cross-sections illustrating a schematic configuration of a portion along an M-M line of FIG. 13 to FIG. 22. FIG. 7C and FIG. 10C are longitudinal sections illustrating an outline of a portion along an N-N line of FIG. 19 and FIG. 22.

Figure 13:
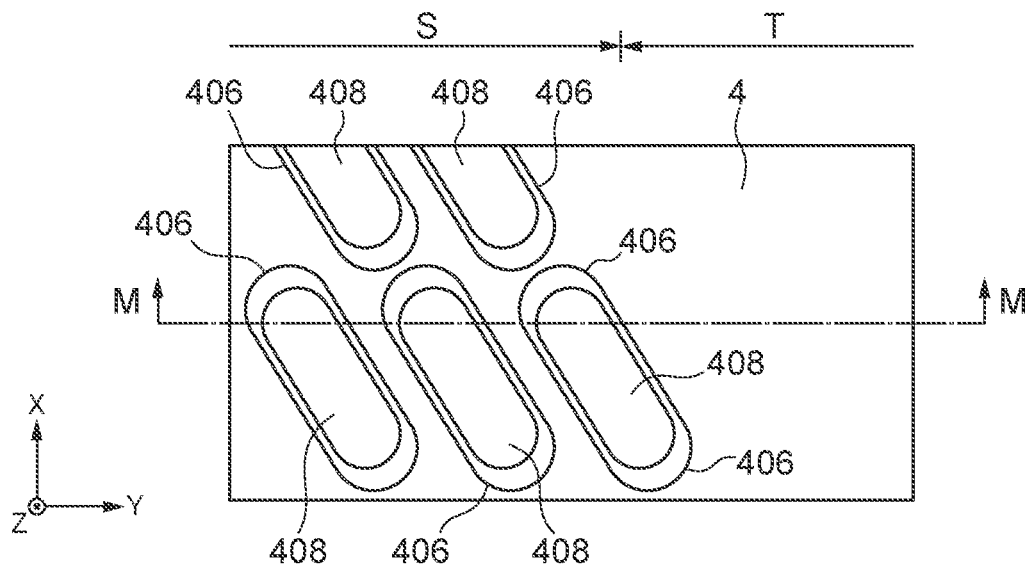
FIGS. 13 to 22 are diagrams illustrating a schematic configuration of the semiconductor device according to the second embodiment and a method of forming the same.
Figure 14:
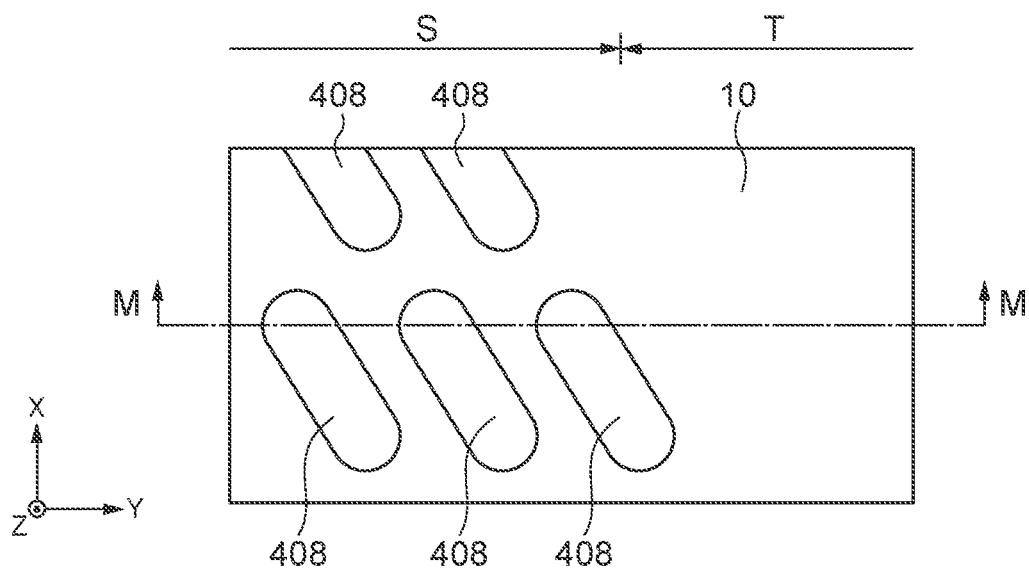
Figure 15:
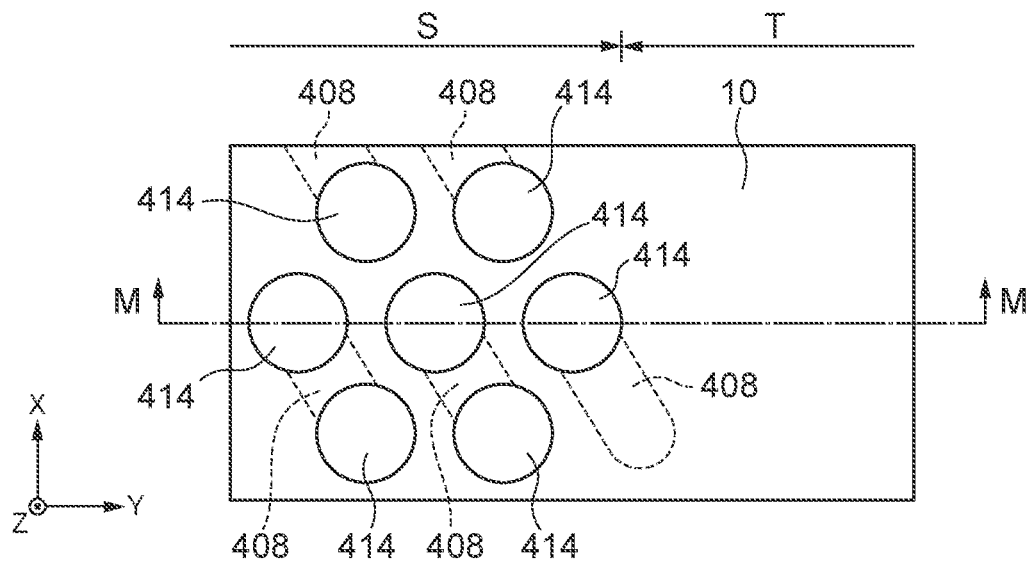
Figure 16:
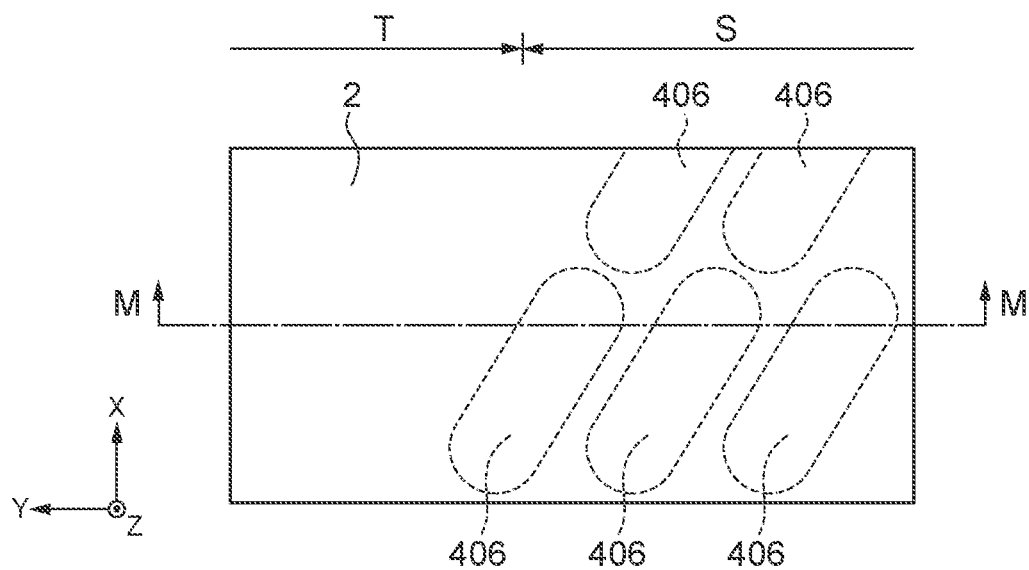
Figure 17:
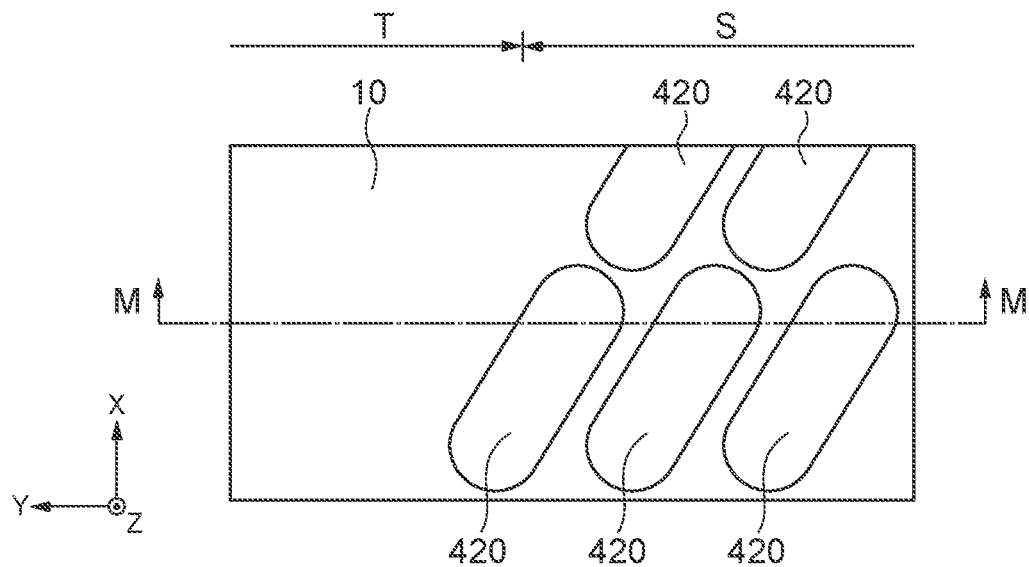
Figure 18:
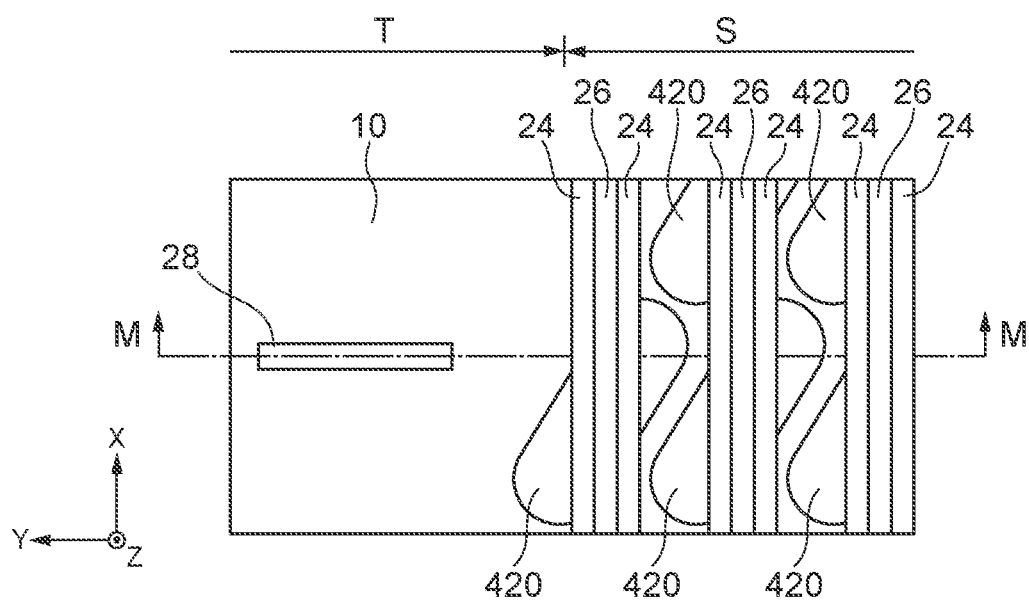
Figure 19:
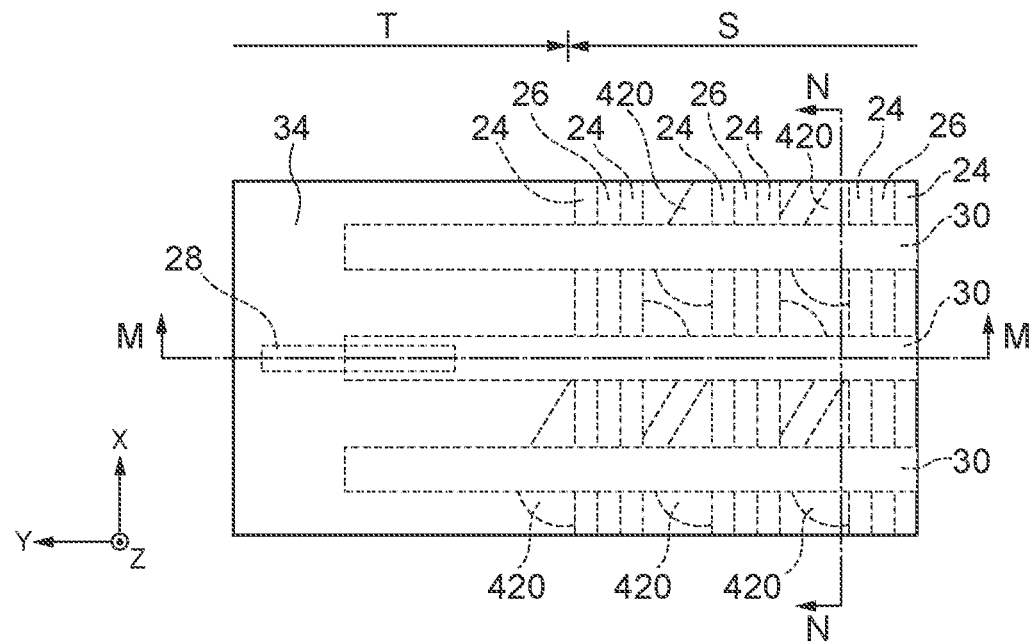
Figure 20:
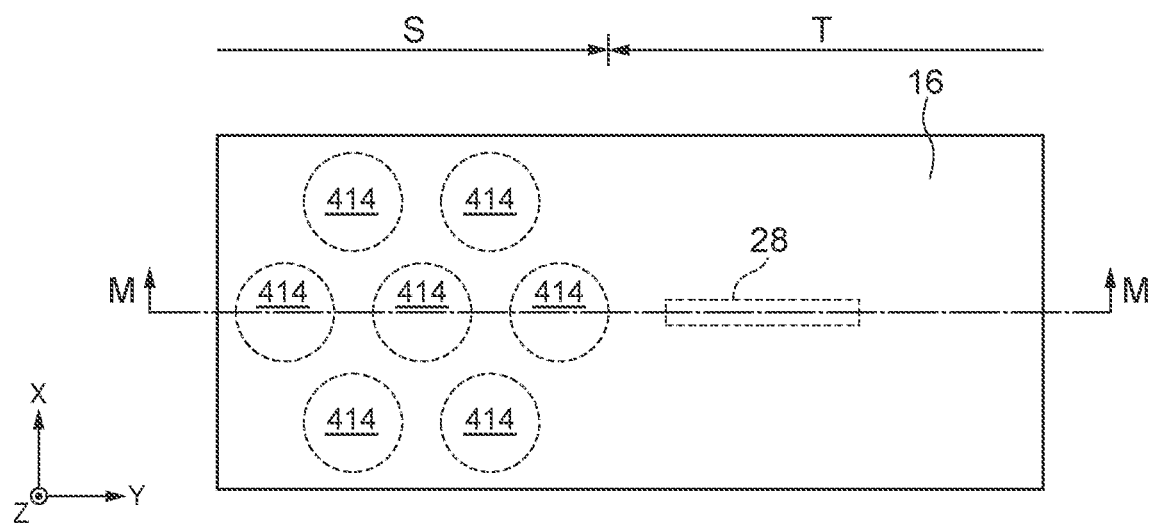
Figure 21:
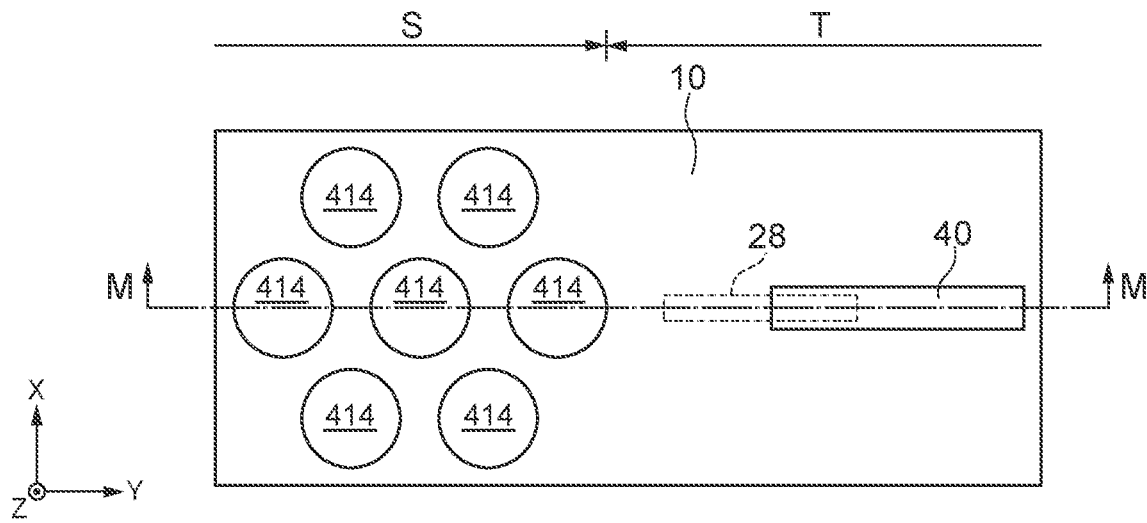
Figure 22:
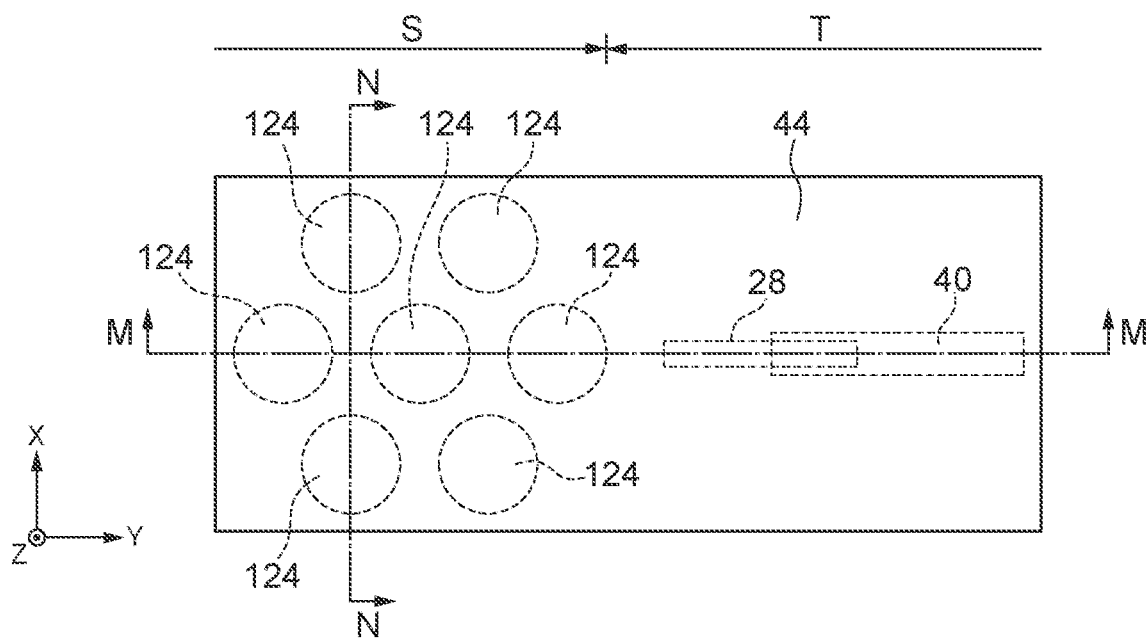

FIG. 13 corresponds to FIG. 1B. FIG. 14 corresponds to FIG. 2B. FIG. 15 corresponds to FIG. 3B. FIG. 16 corresponds to FIG. 4B. FIG. 17 corresponds to FIG. 5B. FIG. 18 corresponds to FIG. 6B. FIG. 19 corresponds to FIG. 7B and FIG. 7C. FIG. 20 corresponds to FIG. 8B. FIG. 21 corresponds to FIG. 9B. FIG. 22 corresponds to FIG. 10B and FIG. 10C.

In the semiconductor device according to the second embodiment, the following matters are different from the semiconductor device according to the first embodiment. The planar shape of the memory cell of the semiconductor device according to the first embodiment is round as illustrated in FIG. 1A and the like, whereas the planar shape of the memory cell of the semiconductor device according to the second embodiment is elliptic as illustrated in FIG. 13 and the like. In the method for forming the semiconductor device according to the second embodiment, second semiconductor layers 406 correspond to the patterned second semiconductor layers 6 in the first embodiment. First insulating material layers 408 correspond to the patterned first insulating material layers 8 in the first embodiment. Conductive material layers 414 correspond to the conductive material layers 14 in the first embodiment. First doped layers 420 correspond to the first doped layers 20 in the first embodiment. In the semiconductor device according to the second embodiment, the same reference numerals are given to substantially the same elements as those of the semiconductor device according to the first embodiment.

The processing to be performed in FIG. 13 is the same as the processing to be performed in FIG. 1A and FIG. 1B of the first embodiment. The processing to be performed in FIG. 14 is the same as the processing to be performed in FIG. 2A and FIG. 2B of the first embodiment. The processing to be performed in FIG. 15 is the same as the processing to be performed in FIG. 3A and FIG. 3B of the first embodiment. The processing to be performed in FIG. 16 is the same as the processing to be performed in FIG. 4A and FIG. 4B of the first embodiment. The processing to be performed in FIG. 17 is the same as the processing to be performed in FIG. 5A and FIG. 5B of the first embodiment. The processing to be performed in FIG. 18 is the same as the processing to be performed in FIG. 6A and FIG. 6B of the first embodiment. The processing to be performed in FIG. 19 is the same as the processing to be performed in FIG. 7A, FIG. 7B and FIG. 7C of the first embodiment. The processing to be performed in FIG. 20 is the same as the processing to be performed in FIG. 8A and FIG. 8B of the first embodiment. The processing to be performed in FIG. 21 is the same as the processing to be performed in FIG. 9A and FIG. 9B of the first embodiment. The processing to be performed in FIG. 22 is the same as the processing to be performed in FIG. 10A, FIG. 10B and FIG. 10C of the first embodiment.

According to the semiconductor device of the second embodiment, the channel width of the access transistor 133 can be set to be larger than that of the semiconductor device according to the first embodiment. The other configurations and the forming method are the same as those of the semiconductor device and the forming method therefor according to the first embodiment.

As described above, the semiconductor devices according to the embodiments have been described by exemplifying DRAM, but this is an example and is not intended to be limited to DRAM. Memory devices other than DRAM, for example, a static random access memory (SRAM), a flash memory, an erasable programmable read only memory (EPROM), a magneto-resistive random access memory (MRAM), and a phase-change memory can be applied as the semiconductor device. Further, devices other than memories, for example, a microprocessor, a logic IC such as an application specific integrated circuit (ASIC) can be applied as the semiconductor devices of the above embodiments.

Although certain embodiments and examples have been described in the present disclosure, it will be understood by those skilled in the art that the scope of the disclosure extends beyond the specifically disclosed embodiments to other alternative embodiments and/or uses of the disclosure and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure herein should not be limited by the particular disclosed embodiments described above.

The invention claimed is:

1. An apparatus comprising: a semiconductor substrate; an access transistor including channel, source and drain regions arranged in a vertical direction to the semiconductor substrate and a gate-electrode facing to the channel region; a storage capacitor coupled to one of the source and drain regions; a plurality of bit-lines including a bit-line coupled to the other of the source and drain regions; an air gap between adjacent two of the plurality of bit-lines, the air gap and the plurality of bit-lines in a same insulating layer; and a pull-out-electrode connected to the bit-line, wherein surfaces of the source and drain regions and the pull-out-electrode on the bit-line side is arranged at substantially the same height from the upper surface of the semiconductor substrate.

2. The apparatus of claim 1, wherein the gate-electrode and the pull-out-electrode include a same conductive material.

3. The apparatus of claim 1, wherein the gate-electrode and the pull-out-electrode include titanium nitride.

4. The apparatus of claim 1, wherein the channel region is surrounded by a dielectric material.

5. The apparatus of claim 1, further comprising a gate insulating film provided in contact with the channel region, the gate-electrode facing the channel region with the gate insulating film interposed therebetween.

6. The apparatus of claim 1, wherein the bit-line includes a conductive material.

7. The apparatus of claim 1, wherein the bit-line includes at least one of tungsten silicide, tungsten nitride, and tungsten.

8. An apparatus comprising:
a semiconductor substrate;
a plurality of access transistors, each including channel, source and drain regions arranged in a vertical direction to the semiconductor substrate and a gate-electrode facing to the channel region;
a plurality of storage capacitors, each coupled to one of the source and drain regions;
a plurality of bit-lines, each coupled to the other of the source and drain regions;
a plurality of pull-out-electrodes coupled to the plurality of bit-lines, respectively; and
a dielectric film covering the plurality of bit-lines with including a plurality of air gaps each provided between corresponding adjacent two of the plurality of bit-lines.

9. The apparatus of claim 8, wherein the gate-electrodes and the pull-out-electrodes include a same conductive material.

10. The apparatus of claim 8, wherein the gate-electrodes and the pull-out-electrodes include titanium nitride.

11. The apparatus of claim 8, wherein the plurality of the channel regions are surrounded by a dielectric film, respectively.

12. The apparatus of claim 8, further comprising a gate insulating film provided in contact with the channel regions, the gate-electrodes facing the channel regions with the gate insulating film interposed therebetween, respectively.

13. The apparatus of claim 8, wherein the bit-lines include a conductive material.

14. The apparatus of claim 8, wherein the bit-lines include at least one of tungsten silicide, tungsten nitride, and tungsten.

* * * * *